United States Patent
Yamaguchi

(10) Patent No.: US 6,888,243 B2
(45) Date of Patent: May 3, 2005

(54) SEMICONDUCTOR DEVICE

(75) Inventor: Yasuo Yamaguchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 351 days.

(21) Appl. No.: 09/964,462

(22) Filed: Sep. 28, 2001

(65) Prior Publication Data
US 2002/0105079 A1 Aug. 8, 2002

(30) Foreign Application Priority Data
Feb. 6, 2001 (JP) ........................................ 2001-029807

(51) Int. Cl.[7] .............................................. H01L 23/48
(52) U.S. Cl. ........................ 257/748; 257/758; 257/774; 257/471
(58) Field of Search ................................ 257/748, 758, 257/280, 613, 471, 774

(56) References Cited

U.S. PATENT DOCUMENTS

| | | | | | |
|---|---|---|---|---|---|
| 4,779,127 | A | * | 10/1988 | Honjo | 357/41 |
| 5,444,015 | A | * | 8/1995 | Aitken et al. | 437/182 |
| 5,457,344 | A | * | 10/1995 | Bartelink | 257/737 |
| 5,900,668 | A | * | 5/1999 | Wollesen | 257/522 |
| 5,937,321 | A | * | 8/1999 | Beck et al. | 438/622 |
| 5,994,777 | A | * | 11/1999 | Farrar | 257/758 |
| 6,034,433 | A | * | 3/2000 | Beatty | 257/758 |
| 6,078,106 | A | * | 6/2000 | Kawata | 257/758 |
| 6,100,589 | A | * | 8/2000 | Tanaka | 257/758 |
| 6,124,604 | A | * | 9/2000 | Koyama et al. | 257/72 |
| 6,130,449 | A | * | 10/2000 | Matsuoka | 257/296 |
| 6,222,270 | B1 | * | 4/2001 | Lee | 257/758 |
| 6,246,118 | B1 | * | 6/2001 | Buynoski | 257/758 |
| 6,297,563 | B1 | * | 10/2001 | Yamaha | 257/781 |
| 6,307,252 | B1 | * | 10/2001 | Knoedl, Jr. | 257/659 |
| 6,337,517 | B1 | * | 1/2002 | Ohta et al. | 257/758 |
| 6,404,001 | B2 | * | 6/2002 | Koo et al. | 257/296 |

FOREIGN PATENT DOCUMENTS

| | | |
|---|---|---|
| JP | 3-248458 | 11/1991 |
| JP | 5-347412 | 12/1993 |
| JP | 10-270704 | 10/1998 |
| JP | 11-135799 | 5/1999 |
| JP | 11-238734 | 8/1999 |
| JP | 11-354807 | 12/1999 |

* cited by examiner

Primary Examiner—David L Talbott
Assistant Examiner—Lourdes Cruz
(74) Attorney, Agent, or Firm—Oblon, Spivak, McClelland, Maier & Neustadt, P.C.

(57) ABSTRACT

To improve the radiation property without inhibiting miniaturization of the device, heat generated at a heat generating layer (5) is radiated to a substrate (1) via plugs (7, 17), wiring layers (8, 18), and plugs (9, 19). A cross sectional along the principal plane of the substrate (1) of the plugs (7, 9, 17, 19) is set to be a rectangle, and the long sides of the rectangle are parallel to the direction perpendicular to the direction connecting one end and the other end of the heat generating layer (5). Between the plugs (9, 19) and the semiconductor layer (2) is interposed n-type semiconductor layers (3, 13).

20 Claims, 12 Drawing Sheets

F/G. 15 (PRIOR ART)
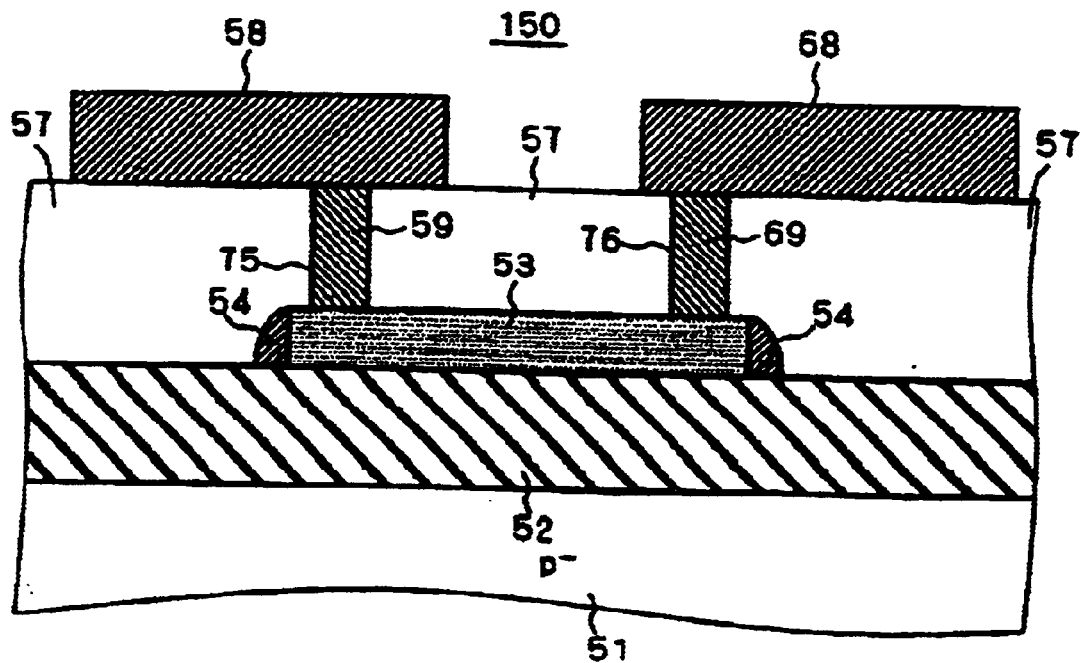
F/G. 16 (PRIOR ART)
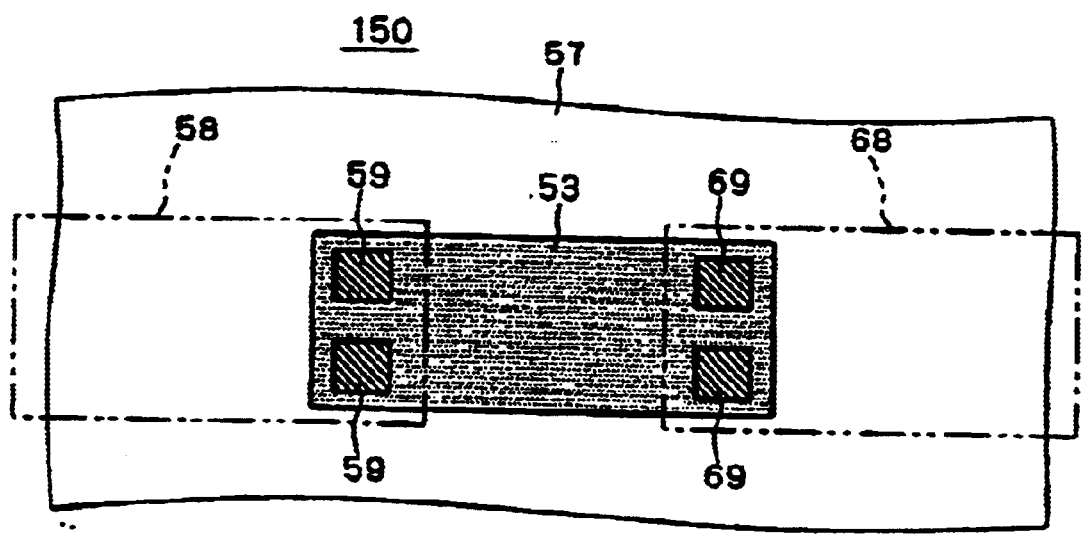

F I G. 19
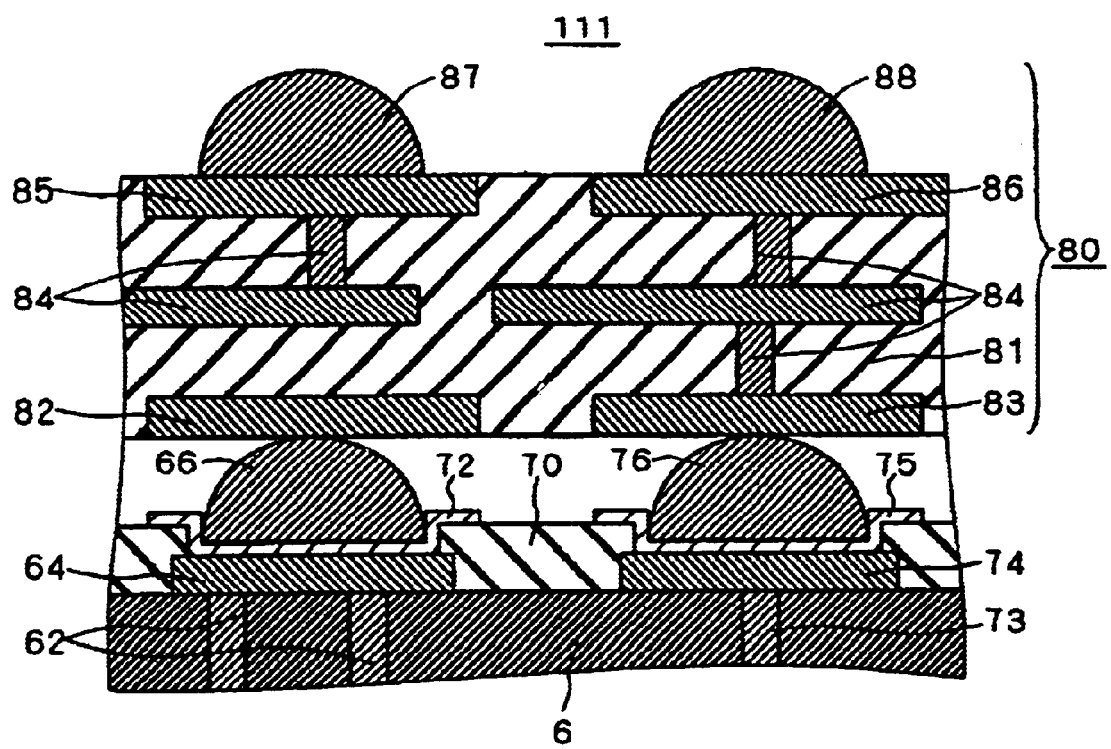

SEMICONDUCTOR DEVICE

BACKGROUND OF THE INVENTION

1. Field of the Invention

The present invention relates to a semiconductor device, and particularly to improvement for increasing the radiation property.

2. Description of the Background Art

FIG. 20 is a top plan view of a conventional semiconductor device which forms the background of the present invention, and FIG. 21 is a vertical section view of the same semiconductor device. FIG. 20 also shows the interior of the semiconductor device in a perspective manner. This semiconductor device 151 comprises a substrate 91, insulation layers 92, 93, a heat generating layer 94, plugs 95, 96 and wiring layers 97, 98.

The substrate 91 is a silicon substrate containing boron at a concentration of about $1 \times 10^{15}$ cm$^{-3}$. The insulation layer 92 is an oxide film of about 300 nm in thickness formed on the substrate 91 as an element separating insulation film. The heat generating layer 94 is selectively formed on the insulation film 92 as a resistor, and made of phosphorous-doped poly-silicon containing phosphorous at a concentration of $1 \times 10^{20}$ to $5 \times 10^{21}$ cm$^{-3}$. The insulation layer 93 is an interlayer insulating film of 500 nm to 1 μm in thickness formed on the insulation layer 92 so as to cover the heat generating layer 94. The insulation layer 93 is usually formed as a combination layer having a non-doped oxide film and a boron/phosphorous-doped oxide film. The wiring layers 97, 98 are wiring layers patterned on the insulation layer 93 and are formed as combination films containing AlCu.

The plugs 95, 96 are conductors filled in contact holes penetrating through the insulation layer 93, and made of tungsten. The plug 96 connects one end of the heat generating layer 94 and the wiring layer 98, and the plug 95 connects the other end of the heat generating layer 94 and the wiring layer 97.

In the semiconductor device 151 configured as described above, as the power to be applied to the heat generating layer 94 serving as a resistance body is increased, the temperature of the heat generating layer 94 increases as shown in the graph of FIG. 22. When this temperature exceeds the maximum operation temperature Tjmax, electro migration occurs in the wiring layers 97, 98, or reliability of the insulation layers 92, 93 decreases, resulting in deterioration of the performance of the device.

The relationship of $\Delta T = \theta \cdot P$ is satisfied between the power P to be applied and the temperature rise $\Delta T$. In the above relationship, "θ" is referred to as heat resistance. Therefore, for suppressing the temperature rise $\Delta T$, it is necessary to lower the heat resistance θ by improving the radiation property. Conventionally, for lowering the heat resistance "θ", there has been an approach that the radiation area is enlarged without changing the resistance value by enlarging the width and length of the heat generating layer 94 at the same ratio. However, this approach had a problem that miniaturization of the semiconductor device 151 is inhibited.

SUMMARY OF THE INVENTION

Thus, the present invention was made to solve the above-mentioned problem of the prior art and it is an object of the present invention to provide a semiconductor device capable of improving the radiation property without inhibiting miniaturization.

In the first aspect, the present invention provides a semiconductor device comprising: a substrate having a principal plane; an insulation layer formed on the principal plane; a heat generating layer embedded in the insulation layer and opposing to the principal plane with a part of the insulation layer interposed therebetween; a first wiring layer disposed on the insulation layer; a second wiring layer disposed on the insulation layer; a first plug embedded in the insulation layer, of which lower end is connected to one end of the heat generating layer and upper end is connected to the first wiring layer, having a cross sectional shape along the principal plane of a rectangle of which short sides are parallel to a main direction connecting the one end and other end of the heat generating layer and long sides are parallel to a direction perpendicular to the main direction; a second plug embedded in the insulation layer, of which lower end is connected to the other end of the heat generating layer and upper end is connected to the second wiring layer; and a third plug embedded in the insulation layer, of which upper end is connected to the first wiring layer or the first plug and lower end reaches the principal plane.

In the second aspect, the present invention provides a semiconductor device comprising: a substrate having a principal plane; an insulation layer formed on the principal plane and made of a low dielectric constant insulator; a heat generating layer embedded in the insulation layer and opposing to the principal plane with a part of the insulation layer interposed therebetween; a first wiring layer disposed on the insulation layer; a second wiring layer disposed on the insulation layer; a first plug embedded in the insulation layer, of which lower end is connected to one end of the heat generating layer and upper end is connected to the first wiring layer; a second plug embedded in the insulation layer, of which lower end is connected to other end of the heat generating layer and upper end is connected to the second wiring layer; and a third plug embedded in the insulation layer, of which upper end is connected to the first wiring layer or the first plug and lower end reaches the principal plane.

In the third aspect, the present invention provides a semiconductor device comprising: a semiconductor substrate having a principal plane; an insulation layer formed on the principal plane; a heat generating layer embedded in the insulation layer and opposing to the principal plane with a part of the insulation layer interposed therebetween; a first wiring layer disposed on the insulation layer; a second wiring layer disposed on the insulation layer; a first plug embedded in the insulation layer, of which lower end is connected to one end of the heat generating layer and upper end is connected to the first wiring layer; a second plug embedded in the insulation layer, of which lower end is connected to other end of the heat generating layer and upper end is connected to the second wiring layer; and a third plug embedded in the insulation layer, of which upper end is connected to the first wiring layer or the first plug and lower end reaches the principal plane, the third plug forming a Schottky barrier between the third plug and the semiconductor substrate.

In the fourth aspect, the present invention provides a semiconductor device comprising: a semiconductor substrate having a principal plane in which an insulation film is selectively formed; a heat generating layer embedded in the insulation layer and opposing to the principal plane with a part of the insulation layer interposed therebetween; a first wiring layer disposed on the insulation layer; a second wiring layer disposed on the insulation layer; a first plug embedded in the insulation layer, of which lower end is connected to one end of the heat generating layer and upper end is connected to the first wiring layer; a second plug embedded in the insulation layer, of which lower end is connected to other end of the heat generating layer and upper end is connected to the second wiring layer; and a third plug embedded in the insulation layer, of which upper end is connected to the first wiring layer or the first plug and lower end reaches the insulation film of the principal plane.

In the fifth aspect, the present invention provides a semiconductor device comprising: a substrate having a principal plane; an insulation layer formed on the principal plane; a heat generating layer embedded in the insulation layer and opposing to the principal plane with a part of the insulation layer interposed therebetween; a first wiring layer disposed on the insulation layer, which is a wiring layer for transmitting stable potential, of which width is elongated so as to be larger than or equal to a width based on a design rule in a region including a portion positioned above one end of the heat generating layer; a second wiring layer disposed on the insulation layer; a first plug embedded in the insulation layer, of which lower end is connected to the one end of the heat generating layer and upper end is connected to the portion of the first wiring layer, having a cross sectional shape along the principal plane of a rectangle of which short sides are parallel to a main direction connecting the one end and other end of the heat generating layer and long sides are parallel to a direction perpendicular to the main direction; and a second plug embedded in the insulation layer, of which lower end is connected to the other end of the heat generating layer and upper end is connected to the second wiring layer.

In the sixth aspect, the present invention provides a semiconductor device comprising: a substrate having a principal plane; an insulation layer formed on the principal plane; a heat generating layer embedded in the insulation layer and opposing to the principal plane with a part of the insulation layer interposed therebetween, the heat generating layer having a channel region and a pair of source and drain regions at one end and other end sandwiching the channel region; a gate electrode embedded in the insulation layer, opposing to the channel region with another part of the insulation layer interposed therebetween; a first wiring layer disposed on the insulation layer, which is a wiring layer for transmitting stable potential, of which width is elongated so as to be larger than or equal to a width based on a design rule in a region including a portion positioned above one of the pair of source and drain regions; a second wiring layer disposed on the insulation layer; a first plug embedded in the insulation layer, of which lower end is connected to the one of the pair of source and drain regions and upper end is connected to the portion of the first wiring layer; a second plug embedded in the insulation layer, of which lower end is connected to other of the pair of source and drain regions and upper end is connected to the second wiring layer; an electrode material layer embedded in the insulation layer, positioned directly under the region of the first wiring layer, made of the same material and having the same thickness as the gate electrode, isolated from the gate electrode; and a connection plug embedded in the insulation layer, of which upper end is connected to the region of the first wiring layer and lower end is connected to the electrode material layer.

In the seventh aspect, the semiconductor device of the sixth aspect of the invention further comprises a third plug embedded in the insulation layer, of which upper end is connected to the electrode material layer and lower end reaches the principal plane.

In the eighth aspect, the present invention provides a semiconductor device comprising: a substrate having a principal plane; an insulation layer formed on the principal plane; a heat generating layer embedded in the insulation layer and opposing to the principal plane with a part of the insulation layer interposed therebetween; a first wiring layer disposed on the insulation layer; a second wiring layer disposed on the insulation layer; a first conductor embedded in the insulation layer, the first conductor connecting one end of the heat generating layer and the first wiring layer; a second conductor embedded in the insulation layer, the second conductor connecting the other end of the heat generating layer and the second wiring layer; a ball electrode formed on the first wiring layer; and a package covering the insulation layer, the first wiring layer, the second wiring layer and the ball electrode and not having an external terminal electrically connected to the ball electrode.

In the ninth aspect of the present invention, the semiconductor device according to any one of the first to fourth aspects of the invention is characterized in that the upper end of the third plug is connected to the first plug.

In the tenth aspect of the present invention, the semiconductor device according to any one of the first, second and seventh aspects of the invention is characterized in that the substrate is a semiconductor substrate and comprises a first semiconductor layer of a first conductive type exposed to the principal plane, and a second semiconductor layer of a second conductive type selectively formed to be surrounded by the first semiconductor layer in a position directly under the third plug in the principal plane.

In the eleventh aspect of the present invention, the semiconductor device according to the third aspect of the invention is characterized in that the semiconductor substrate comprises a first semiconductor layer of a first conductive type exposed to the principal plane, and a second semiconductor layer of a second conductive type selectively formed to be surrounded by the first semiconductor layer in the position directly under the third plug in the principal plane.

In the twelfth aspect of the present invention, the semiconductor device according to any one of second to fourth and sixth to eighth aspects of the invention is characterized in that a cross sectional shape of the first plug along the principal plane is a rectangle of which short sides are parallel to a main direction connecting the one end and the other end of the heat generating layer and long sides are parallel to a direction perpendicular to the main direction.

In the thirteenth aspect of the present invention, the semiconductor device according to any one of the first, third to eighth and eleventh aspects of the invention is characterized in that the insulation layer is made of a low dielectric constant insulator.

In the fourteenth aspect of the present invention, the semiconductor device according to any one of the first to fourth, eighth, ninth and eleventh aspects of the invention is characterized in that the first wiring layer is a wiring layer for transmitting stable potential, of which width is elongated so as to be larger than or equal to a width based on a design rule in a region including a connection portion between the first wiring layer and the first plug.

In the fifteenth aspect of the present invention, the semiconductor device according to any one of the first, fifth and twelfth aspects of the invention is characterized in that length L of the long sides is set so as to satisfy a following relationship of $L \cdot S \geq 5 \, \mu m \cdot D$ with respect to depth D of the first plug and length S of the short sides.

In the sixteenth aspect of the present invention, the semiconductor device according to any one of the first, fifth and twelfth aspects of the invention is characterized in that the firs plug is divided into a plurality of unit plugs, a cross sectional shape of each of the plurality of unit plugs along the principal plane is a rectangle of which short sides are parallel to the main direction and long sides are parallel to a direction perpendicular to the main direction; length S of the short sides and depth D are common with each other among the plurality of unit plugs, and total sum L of length of the long sides of each of the plurality of unit plugs is set so as to satisfy a relationship of L·S≧5 μm·D.

In the seventeenth aspect of the present invention, the semiconductor device according to any one of the first, fifth, twelfth and fourteenth to sixteenth aspects of the invention is characterized in that length of the short sides is set in a range of 1.0 to 1.5 times of a plug width based on a design rule.

In the eighteenth aspect of the present invention, the semiconductor device according to any one of the first, fourth, seventh, tenth and eleventh aspects of the invention is characterized in that a cross sectional shape of the third plug along the principal plane is a rectangle.

In the nineteenth aspect of the present invention, the semiconductor device according to the sixth aspect of the invention is characterized in that a cross sectional shape of the connection plug along the principal plane is a rectangle.

In the twentieth aspect of the present invention, the semiconductor device according to any on of the first to fourth, ninth and eleventh aspects of the invention further comprises a fourth plug embedded in the insulation layer, of which upper end is connected to the second wiring layer or the second plug and lower end reaches the principal plane.

In the device of the first aspect of the invention, since the heat generated at the heat generating layer due to the current supplied via the first and the second wiring layers is radiated to the substrate via the third plug, temperature rise in the heat generating layer is efficiently suppressed. Furthermore, since the cross sectional shape of the first plug is rectangle of which long sides are parallel to the direction perpendicular to the main direction of the heat generating layer, radiation property from the first plug to the first wiring layer is improved without causing difficulty in filling the first plug during the production process of the device.

In the device of the second aspect of the invention, since the heat generated at the heat generating layer due to the current supplied via the first and the second wiring layers is radiated to the substrate via the third plug, temperature rise in the heat generating layer is efficiently suppressed. Furthermore, since the insulation layer is made of a low dielectric constant insulator having low heat conductivity, improving the radiation efficiency to the substrate will effectively contribute to suppression of the temperature rise in the heat generating layer.

In the device of the third aspect of the invention, since the heat generated at the heat generating layer due to the current supplied via the first and the second wiring layers is radiated to the semiconductor substrate via the third plug, temperature rise in the heat generating layer is efficiently suppressed. Furthermore, since the Schottky barrier is formed between the third plug and the semiconductor substrate, leak current flowing between the first wiring layer and the semiconductor substrate is suppressed.

In the device of the fourth aspect of the invention, since the heat generated at the heat generating layer due to the current supplied via the first and the second wiring layers is radiated to the semiconductor substrate via the third plug, temperature rise in the heat generating layer is efficiently suppressed. Furthermore, since the third plug is connected with the insulation layer selectively formed in the principal plane of the semiconductor substrate, the first wiring layer and the semiconductor substrate are electrically insulated, so that leak current flowing therebetween is suppressed.

In the device of the fifth aspect of the invention, since the heat generated at the heat generating layer due to the current supplied via the first and the second wiring layers is radiated to the first wiring layer having large width and serving as a radiation plate via the first plug, temperature rise in the heat generating layer is efficiently suppressed. Since the first wiring layer is a stable potential wiring layer, parasitic capacitance generated between the first wiring layer and the substrate due to its large width will not have an influence on the operation of the device. Furthermore, since the cross sectional shape of the first plug is a rectangle of which long sides are parallel with the direction perpendicular to the main direction of the heat generating layer, high radiation property is obtained without causing difficulty in filling the first plug during the production process of the device.

In the device of the sixth aspect of the invention, since the heat generated at the heat generating layer due to the current supplied via the first and the second wiring layers is radiated to the first wiring layer having large width and serving as a radiation plate via the first plug, temperature rise in the heat generating layer is efficiently suppressed. Since the first wiring layer is a stable potential wiring layer, parasitic capacitance generated between the first wiring layer and the substrate due to its large width will not have an influence on the operation of the device. Furthermore, since the heat transmitted to the first wiring layer is radiated also to the electrode material layer via the connection plug, high radiation property is obtained. Since the electrode material layer is isolated from the gate electrode, it will not inhibit the function of the gate electrode. Furthermore, since the electrode material layer is made of the same material and has the same thickness as the gate electrode, it can be formed concurrently with the gate electrode during the production process of the device, so that increase in the production cost is suppressed.

In the device of the seventh aspect of the invention, since the heat transmitted to the electrode material layer is radiated also to the substrate via the third plug, radiation efficiency is further improved.

In the device of the eighth aspect of the invention, since the heat generated at the heat generating layer due to the current supplied via the first and the second wiring layers is radiated to the package via the first conductor, first wiring layer and the ball electrode which does not need to transmit the current but is exclusively used for heat radiation, temperature rise in the heat generating layer is efficiently suppressed.

In the device of the ninth aspect of the invention, since the upper end of the third plug is connected to the first plug, the third plug virtually corresponds to the elongated portion of the first plug. Accordingly, a space for forming the third plug is not required, so that miniaturization of the device will not inhibited. Furthermore, since the first plug and the third plug can be concurrently formed in the same process, increase in the production cost is suppressed.

In the device of the tenth aspect of the invention, leak current flowing between the first wiring layer and the semiconductor substrate is suppressed by the p-n junction formed between the first semiconductor layer and the second semiconductor layer.

In the device of the eleventh aspect of the invention, leak current flowing between the first wiring layer and the semiconductor substrate is suppressed by the p-n junction formed between the first semiconductor layer and the second semiconductor layer.

In the device of the twelfth aspect of the invention, since the cross sectional shape of the first plug is a rectangle of which long sides are parallel to the direction perpendicular to the main direction of the heat generating layer, high radiation property is obtained without causing difficulty in filling the first plug during the production process of the device.

In the device of the thirteenth aspect of the invention, since the insulation layer is made of a low dielectric constant insulator having low heat conductivity, improving the radiation efficiency to the substrate will effectively contribute to suppression of the temperature rise in the heat generating layer.

In the device of the fourteenth aspect of the invention, since the width of the first wiring layer is large, the first wiring layer functions as a radiation plate. Therefore, the heat generated at the heat generating layer is efficiently radiated to the first wiring layer via the first plug. Furthermore, since the first wiring layer is a stable potential wiring layer, parasitic capacitance generated between the first wiring layer and the substrate due to the large width will not have an influence on the operation of the device.

In the device of the fifteenth aspect of the invention, since the shape of the first plug is optimized, temperature rise in the heat generating layer is suppressed below the practical standard value even under the strictest use condition.

In the device of the sixteenth aspect of the invention, since the shape of the first plug is optimized, temperature rise in the heat generating layer is suppressed below the practical standard value even under the strictest use condition.

In the device of the seventeenth aspect of the invention, since the length of the short sides in the cross section of the rectangle of the first plug is set 1.0 to 1.5 times the plug width according to the design rule, sufficient filling of the first plug is ensured during the production process of the device.

In the device of the eighteenth aspect of the invention, since the cross sectional shape of the third plug is a rectangle, it is possible to obtain high radiation property without causing difficulty in filling the third plug during the production process of the device.

In the device of the nineteenth aspect of the invention, since the cross sectional shape of the connection plug is a rectangle, it is possible to obtain high radiation property without causing difficulty in filling the connection plug during the production process of the device.

In the device of the twentieth aspect of the invention, since the heat generated at the heat generating layer due to the current supplied via the first and the second wiring layers is radiated to the substrate also via the fourth plug, temperature rise in the heat generating layer is further suppressed.

These and other objects, features, aspects, and advantages of the present invention will become more apparent from the following detailed description of the present invention when taken in conjunction with the accompanying drawings.

BRIEF DESCRIPTION OF THE DRAWINGS

FIG. 15 is a top plan view of a device according to another example of the seventh preferred embodiment;

FIG. 16 is a vertical sectional view of a device according to yet another example of the seventh preferred embodiment;

FIG. 19 is a vertical sectional view of the device according to the eighth preferred embodiment;

DESCRIPTION OF THE PREFERRED EMBODIMENTS

First, definition of "heat generating layer" in the present invention will be explained. In the present invention, the term "heat generating layer" means a device element configured so as to allow electric current to flow therethrough. To the heat generating layer, for example, a plug is connected so as to allow electric current to flow. When the electric current flows, Joule heat is generated in the heat generating layer, however, the heat generating layer is not limited to such a device element that actively uses the generated heat. For example, the heat generating layer includes device elements such as a resistor constituting a resistance element and a semiconductor layer constituting a MOS transistor device and the like. Materials for the heat generating layer include, for example, single-crystalline semiconductors, polycrystalline semiconductors, metals and the like.

First Preferred Embodiment

Figure 1:
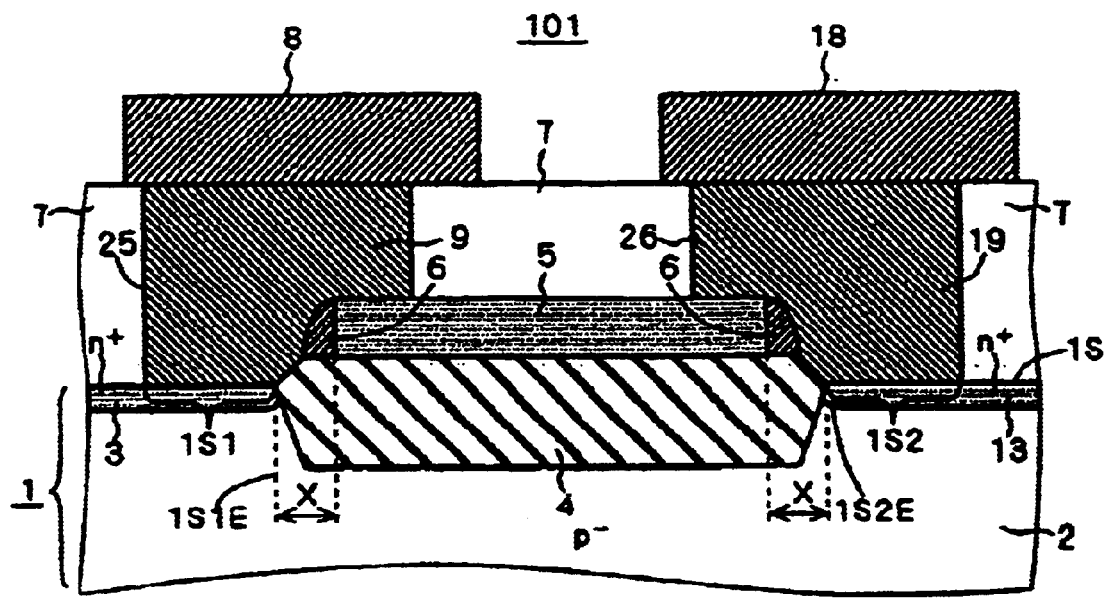
FIG. 1 is a vertical sectional view of a device according to the first preferred embodiment.
Figure 2:
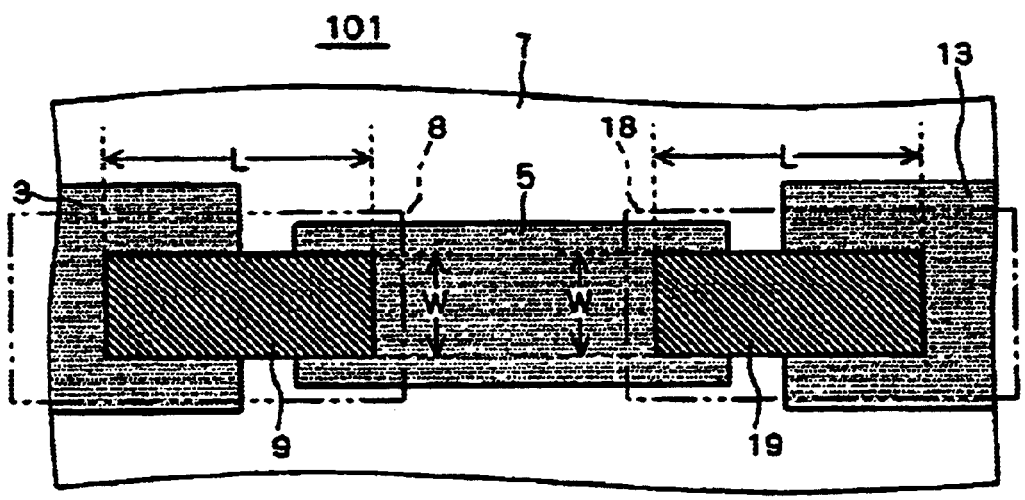
FIG. 2 is a top plan view of the device according to the first preferred embodiment.

FIG. 1 is a vertical sectional view showing a semiconductor device according to the first preferred embodiment of the present invention. FIG. 2 is a top plan view of the same semiconductor device. FIG. 2 also shows the interior of the semiconductor device in a perspective manner. This semiconductor device 101 comprises a substrate 1, insulation layers 4, 6, heat generating layer 5, plugs 7, 9, 17, 19 and wiring layers 8, 18. The substrate 1 is a silicon substrate having a principal plane and comprises a p-type semiconductor layer 2 exposed to the principal plane and n-type semiconductor layers 3, 13 selectively formed so as to be surrounded by the semiconductor layer 2 in the positions directly under the plugs 9, 19 in the principal plane. The semiconductor layer 3 and the semiconductor layer 13 are formed so as to be separated from each other. The semiconductor layers 3, 13 can be readily formed during the production process of the semiconductor device 101 by selectively introducing an n-type impurity to the principal plane of the substrate 1 through contact holes to which plugs 9, 19 are to be filled, after forming these contact holes in the insulation layers 4, 6. The semiconductor layer 2 contains boron at a concentration of, for example, about $1 \times 10^{15}$ cm$^{-3}$. A desired concentration of impurity of the semiconductor layers 3, 13 will be described later in the fourth preferred embodiment.

The insulation layer 4 is formed on the substrate 1 as an element separating insulation film and is an oxide film having a thickness of about 300 nm. The heat generating layer 5 is selectively formed on the insulation layer 4 as a resistor, and made of phosphorous-doped poly-silicon containing phosphorus at a concentration of $1 \times 10^{20}$ to $5 \times 10^{21}$ cm$^{-3}$. The heat generating layer 5 is opposed to the principal plane of the substrate 1 with the insulation layer 4 interposed therebetween. The insulation layer 6 is an interlayer insulating film of 500 nm to 1 $\mu$m in thickness formed on the insulation layer 4 so as to cover the heat generating layer 5. The insulation layer 4 is formed, for example, as a combination layer having a non-doped oxide film and a boron/phosphorous-doped oxide film. The wiring layers 8, 18 are wiring layers provided by patterning the wiring material deposited on the insulation layer 6, and are formed, for example, as combination films containing AlCu.

The plugs 7, 9, 17, 19 are conductors filled in the contact holes penetrating through the insulation layers 4, 6, that is, are conductors embedded in the insulation layers 4, 6, and are made, for example, of tungsten. In the case where copper (Cu) is used as the material for the wiring layers 8, 18, for example, copper is used as the material of the plugs 7, 9, 17, 19. The plugs 7 and 17 are respectively connected at their lower ends to one end and the other end of the heat generating layer 5, and at their upper ends to the wiring layers 8 and 18. The plugs 9, 19 are respectively connected at their upper ends to the wiring layers 8 and 18, and at their lower ends to the semiconductor layers 3 and 13 in the principal plane of the substrate 1.

Since the semiconductor device 101 is thus configured, the heat generated in the heat generating layer 5 due to the electric current supplied via the wiring layers 8, 18 is radiated to the substrate 1 via the plugs 7, 17, wiring layers 8, 18 and plugs 9, 19. As a result of this, the heat resistance $\theta$ with respect to the heat generated in the heat generating layer 5 is suppressed, so that the temperature rise $\Delta T$ in the heat generating layer 5 is efficiently suppressed. As distinct from the conventional device, in the semiconductor device 101, it is not necessary to widen the heat generating layer 5 for reducing the heat resistance $\theta$, so that miniaturization will not be inhibited.

Furthermore, since the semiconductor layers 3, 13 are interposed between the plugs 9, 19 and the semiconductor layer 2, leak current flowing between the wiring layers 8, 18 and the substrate 1 is suppressed by the p-n junction formed between the semiconductor layer 2 and the semiconductor layers 3, 13. Therefore, even if the plugs 9, 19 and the substrate 1 are connected, the function of the heat generating layer 5 as a resistor will not be deteriorated. This is because in the normal operation of the semiconductor device 101, the potential of the substrate 1 (that is, electric potential of the semiconductor layer 2) is kept at the ground potential, and the ground potential or higher potential is imparted to the wiring layers 8, 18, so that only zero bias or reverse bias is applied to the p-n junction (that is, p-n diode) and forward bias will not be applied.

As shown in FIG. 2, the cross sectional shapes along the principal plane of the substrate 1 of the plugs 7, 9, 17, 19 are designed to be rectangular. Short sides of the rectangle are parallel to the direction connecting the one end and the other end of the heat generating layer 5 (referred to as "main direction" of the heat generating layer 5 for convenience; corresponding to the horizontal direction in FIG. 2) and long sides are perpendicular to the main direction. Accordingly, it is possible to secure large cross-section area for the plugs 7, 9, 17, 19 in positions close to the heat generating portion of the heat generating layer 5 without causing difficulty in filling the plugs 7, 9, 17, 19 during the production process of the semiconductor device 101. As a result of this, the heat resistance $\theta$ is further reduced, and thus the temperature rise $\Delta T$ in the heat generating layer 5 is suppressed more efficiently.

Figure 20:
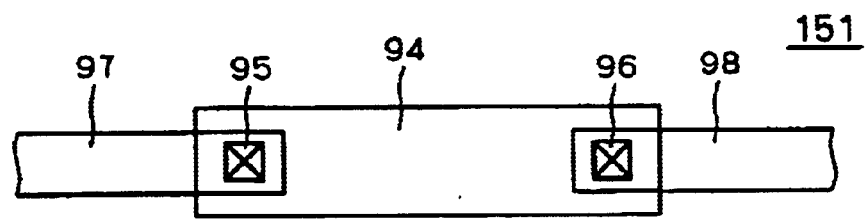
FIG. 20 is a top plan view of a conventional device.
Figure 21:
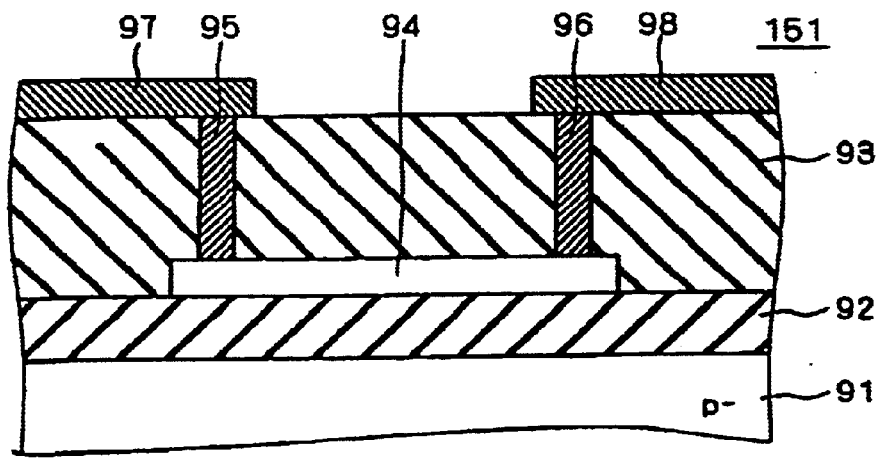
FIG. 21 is a vertical sectional view of the conventional device.
Figure 22:
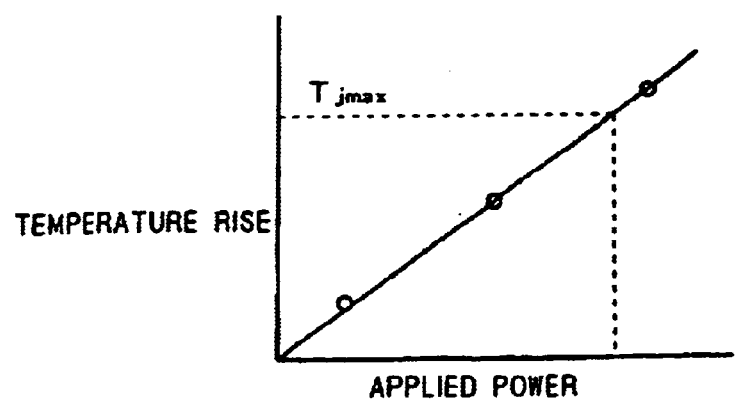
FIG. 22 is a graph for explaining the operation of the conventional device.

Preferably, length S of the short sides is set in the range of 1.0 to 1.5 times of the plug width based on the design rule (the width of the plugs 94, 95 of the conventional semiconductor device 151 shown in FIG. 20 corresponds to this width.). As a result of this, it is secured that when the conductive material which is to become the plugs 7, 9, 17, 19 is deposited during the production process of the semiconductor device 101, the conductor material is sufficiently filled into the contact holes.

More preferably, when the depth of each plug 7, 9, 17, 19 is defined as D, the length of long sides L of each plug 7, 9, 17, 19 is set so as to satisfy the relationship of $L \cdot S \geq 5$ $\mu$m$\cdot$D, with respect to the length of short sides S. As will be described below, by applying this requirement, even under the strictest service condition in the practical use, it is possible to suppress the temperature rise in the heat generating layer 5 to the practical standard value or less.

The heat resistance $\theta$ of a plug can be represented by $\theta = D/(k \cdot A) = D/(k \cdot L \cdot S)$, wherein "k" is heat conductivity of the plug and "A" is cross sectional area of the plug. The temperature rise $\Delta T$ can be represented by $\Delta T = \theta \cdot P$, wherein "P" is power. In the case where the material of the plug is tungsten (W) which is most widely used and has lowest heat conductivity among practical plug materials, the heat conductivity k is: approximate $k = 200$ Wm$^{-1}$K$^{-1}$. Assuming the duty of power application be ½, then the practical, typical power consumption is: 1 V/50 $\Omega \times$½$ = 10$ mW. Accordingly, the temperature rise $\Delta T$ is: $\Delta T = (0.01$ K$\cdot$m/200)$\cdot$D/(L$\cdot$S)$ = 50$ K$\cdot \mu$m$\times$D/(L$\cdot$S).

In the case where the maximum operation temperature Tjmax is 120° C. and the allowable temperature as a manufacturer's guaranteed value is set at 100° C., it is necessary to suppress the temperature rise $\Delta T$ to 10 K for keeping 10% margin. Therefore, when the relationship of $L \cdot S \geq 5$ $\mu$m$\cdot$D is satisfied between D, L and S, the temperature of the heat generating layer 5 is suppressed to the maximum operation temperature Tjmax or less while keeping 10% margin even under the strictest use condition. In the case where the material of the plug is replaced by practical materials (copper, for example) other than tungsten, the radiation property further increases, so that it is enough to satisfy the requirement of L·S≧5 μm·D for suppressing the temperature rise to the standard value or less.

Though omitted in the drawings, it is also possible to locate each of the plugs 7, 9, 17, 19 while dividing them into plural unit plugs. For example, in FIG. 2, it is possible to arrange the plugs 17 while dividing into plural pieces arranged in the direction of the length L. Each of the divisionally arranged unit plugs has a rectangular cross section, and the length S of short sides and the depth D are set at common values among different unit plugs. In this case, defining total sum of long side of each unit plug as L, if the relationship L·S≧5 μm·D is satisfied, the same effect as described above can be obtained.

The above-described preferred condition regarding the length of long sides L and the length of short sides S is also applicable to the following any of preferred embodiments employing plugs having a rectangular cross section, providing the same advantage.

The semiconductor device 101 exerts the effect in particular when insulating materials called low dielectric constant insulators in the art (SiOC CVD film, organic coating film or the like) are used for the insulation layers 4, 6. The low dielectric constant insulators are very useful materials for improving the operation speed of the device by reducing the parasitic capacitance of the wiring because they are significantly low in dielectric constant compared to that of silicon oxides. However, the low dielectric constant insulators have a problem of raising the heat resistance θ because of their low heat conductivity. To the contrary, when the low dielectric constant insulators are used for the material of the insulation layers 4, 6 of the semiconductor device 101, it is possible to realize both improvement of operation speed and improvement of radiation property. This also applies to semiconductor devices 102 to 111 according to the preferred embodiments as will be described below.

In FIGS. 1 and 2, the example where any of the plugs 7, 9, 17, 19 have a rectangular cross section. However, similar effect can be obtained even in the case where only plugs 7, 17 in the position closest to the heat generating layer 5 have a rectangular cross section. Furthermore, similar effect can be obtained even in the case where either one (plug 17, for example) of the plugs 7, 17 has a rectangular cross section. Furthermore, similar effect can be obtained in the case where either one of the plugs 9, 19 is omitted, and for example, only the wiring layer 18 from the wiring layers 8, 18 is connected to the substrate 1 via the plug 19. In this case, it is preferable that the plug 9 or 19 is connected to the side of the wiring layers for transmitting stable potential such as ground wiring layer, power wiring layer or the like. As the result of this, it is possible to reduce the parasitic capacitance between the substrate 1 and the wiring layer.

Furthermore, the heat generating layer 5 may be formed as a resistor made of materials other than poly-silicon such as metals. In particular, by using metals of the type that has low temperature coefficient (ratio of change in resistivity with respect to change in temperature) as the material of the heat generating layer 5, it becomes possible to form a resistance device having high resistance accuracy within the semiconductor device 101.

Second Preferred Embodiment

Figure 3:
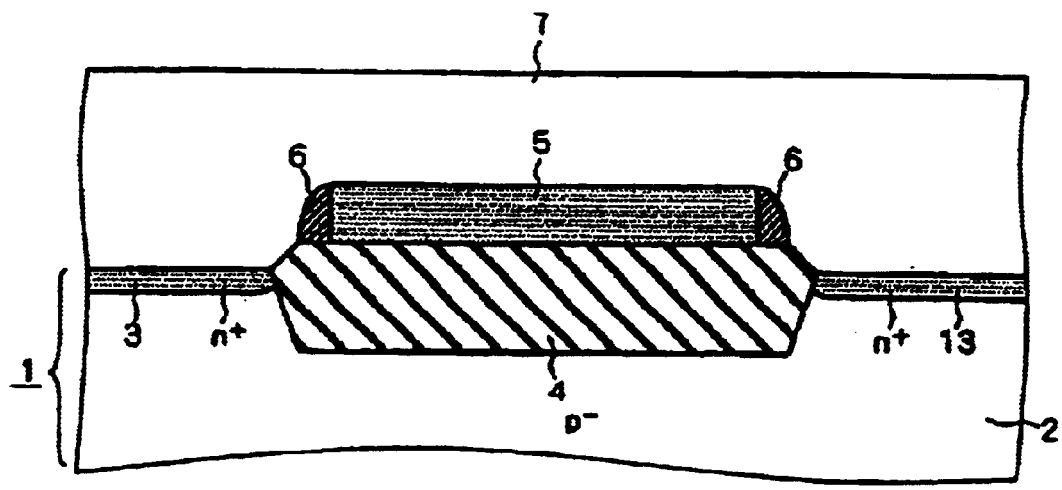
FIG. 3 is a vertical sectional view of a device according to the second preferred embodiment.
Figure 4:
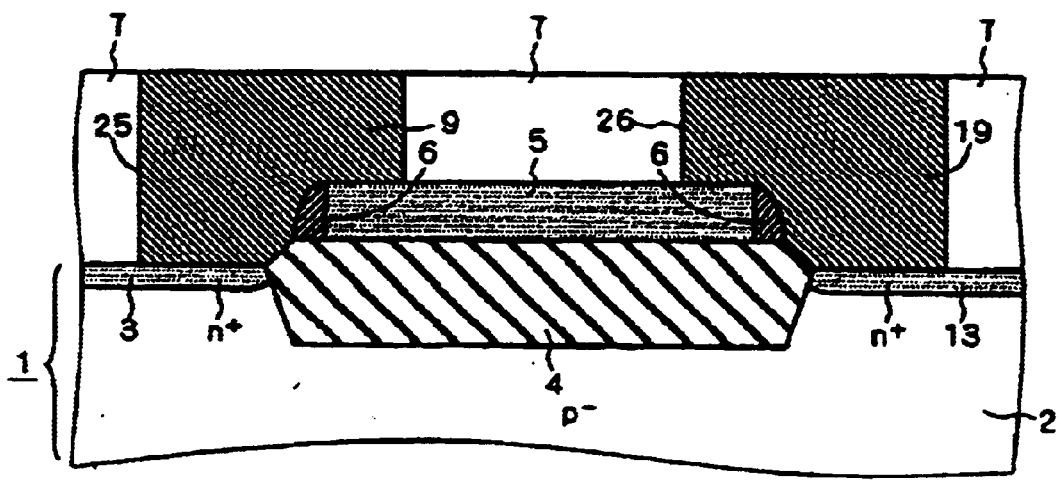
FIG. 4 is a top plan view of the device according to the second preferred embodiment.
Figure 5:
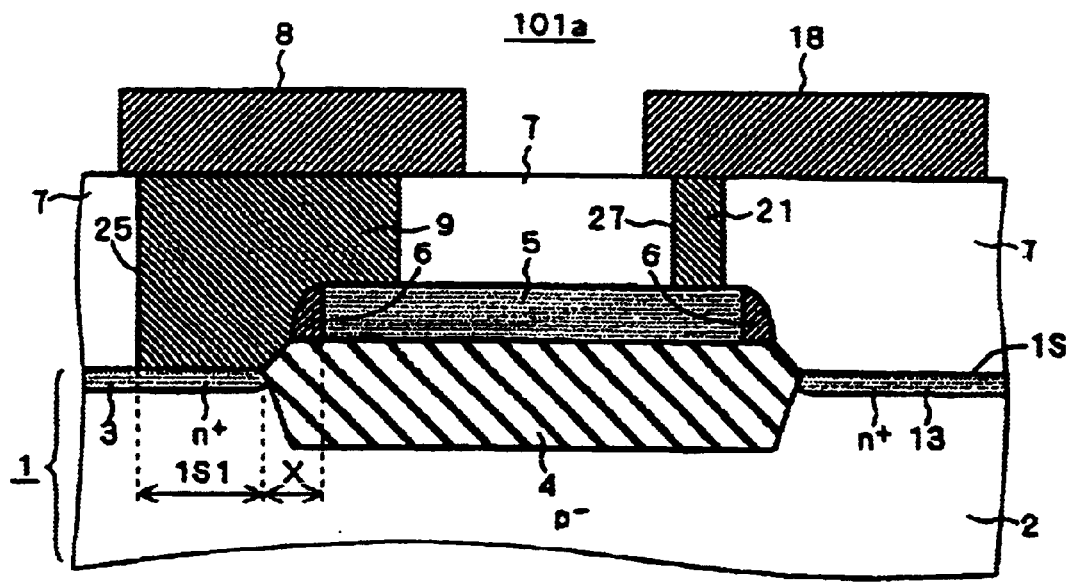
FIG. 5 is a partially enlarged sectional view of the device according to the second preferred embodiment.

FIG. 3 is a vertical sectional view of a semiconductor device according to the second preferred embodiment of the present invention, and FIG. 4 is a top plan view showing the interior of the same semiconductor device in a perspective manner. FIG. 5 is an enlarged sectional view showing a part of FIG. 3 while enlarging the same. This semiconductor device 102 is different in terms of its feature from the semiconductor device 101 according to the first preferred embodiment in that the heat generating layer 5 is a constituent of a MOS transistor device and each of the plugs 7, 9, 17, 19 is arranged while being divided into plural pieces along the main direction of the heat generating layer 5.

The heat generating layer 5 is formed as a semiconductor layer, and has a pair of source and drain regions 21, 22 disposed at one end and the other end along the main direction and a channel region 20 interposed therebetween. As shown in FIG. 5, the heat generating layer 5 may be formed with a pair of additional source and drain regions (for example, extension region, LDD region and the like) 21a, 22a and a pair of pocket implantation regions 20a, 20b. A gate electrode 23 is opposed to the top surface of the channel region 20 with a gate insulation film 10 as a part of the insulation layer 6 interposed therebetween. The gate electrode 23 is embedded in the insulation layer 6. The plug 7 is connected to one of the pair of source and drain regions 21, 22 (for example, drain region 21), and the plug 17 is connected to the other one of the pair of source and drain regions 21, 22 (for example, source region 22). In correspondence with that each of the plugs 9, 19 is divided into plural pieces, each of the semiconductor layers 3, 13 is also divided into plural pieces.

In the semiconductor device 102, since each of the plugs 7, 9, 17, 19 is arranged while being divided into plural pieces, the heat resistance θ is further reduced. As shown in FIG. 4, the plug arranged with being divided into plural pieces may partially have a square cross section similar to that of the prior art. In this case, as shown in FIG. 4, it is preferable that the plug having a rectangular cross section is arranged on the side closer to the heat generating portion (i.e., channel region 20) of the heat generating layer 5.

While in FIGS. 3 to 5 the case where the heat generating layer 5 is a constituent of an n-channel-type MOS transistor device has been shown, of course it is possible to make the heat generating layer 5 be a constituent of a p-channel-type MOS transistor device by reversing the conductive type of each region.

Third Preferred Embodiment

Figure 6:
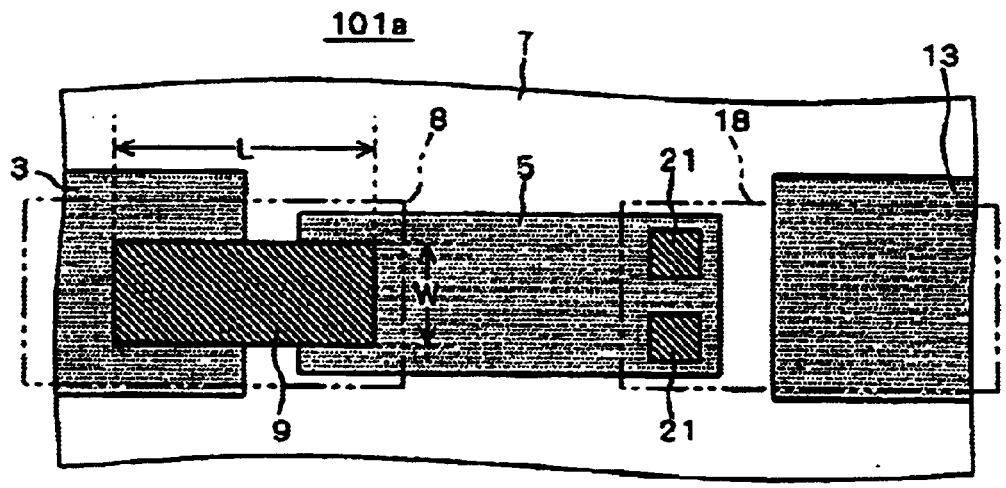
FIG. 6 is a vertical sectional view of a device according to the third preferred embodiment.

FIG. 6 is a vertical sectional view of a semiconductor device according to the third preferred embodiment of the present invention. This semiconductor device 103 is different in terms of its feature from the semiconductor device 101 according to the first preferred embodiment in that the semiconductor layers 3, 13 are formed in the principal plane of the substrate 1 as wells. In the semiconductor device 103, since the wells formed before formation of the insulation layers 4, 6 in the course of the production process are utilized as the semiconductor layers 3, 13, it is possible to omit the process of forming the semiconductor layers 3, 13 by introducing impurities via the contact holes.

In the case where each of the plugs 9, 19 is arranged while being divided into plural pieces as is in the semiconductor device 102 of the second preferred embodiment, it is also possible to connect the plural plugs 9 to the single well 3 and connect the plural plugs 19 to the single well 13. Preferred concentration of impurities of the semiconductor layers 3, 13 serving as wells will be described in the next fourth preferred embodiment.

Fourth Preferred Embodiment

In the present preferred embodiment, various preferred embodiments as to the structure of the connecting portion between the plugs 9, 19 and the substrate 1 in the semiconductor devices 101 to 103 of the first to third preferred embodiments will be explained. In the following FIGS. 7 to 9, a connection portion between the plug 19 and the substrate 1 is drawn as a representative.

Figure 7:
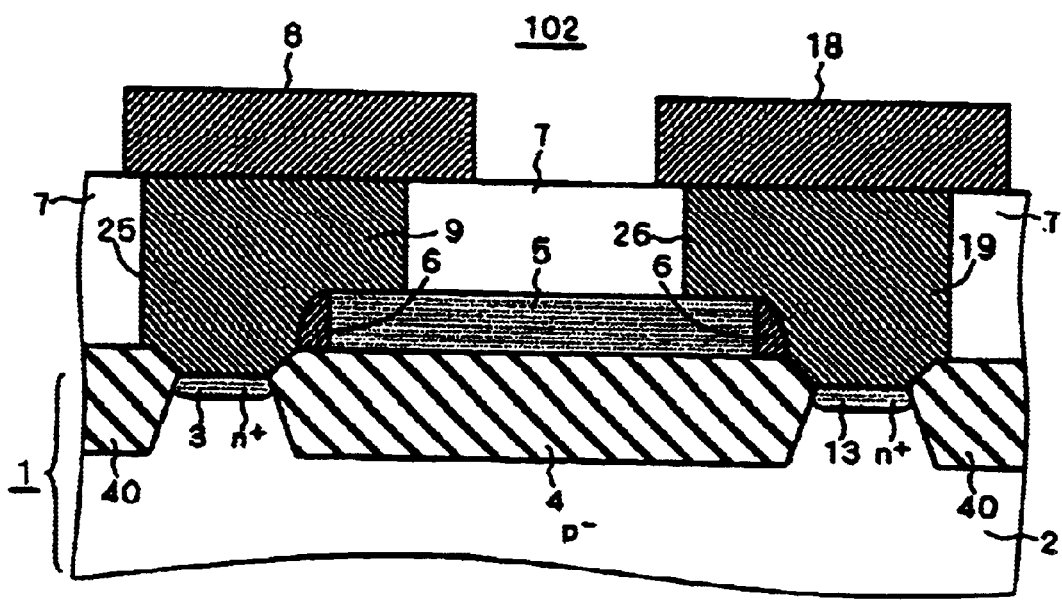
FIG. 7 is a partial section view of a device according to the first example of the fourth preferred embodiment.

In a semiconductor device 104 shown in FIG. 7, an insulation film 30 is formed in place of the n-type semiconductor layers 3, 13 in the substrate 1. The insulation film 30 is selectively formed in the positions directly under the contact holes into which the plugs 9, 19 are filled on the principal plane of the substrate 1. Therefore, the insulation film 30 is interposed between the plugs 9, 19 and the semiconductor layer 2. The insulation film 30 can be readily formed as an oxide film by selectively oxidizing the principal plane of the substrate 1 via contact holes after the contact holes into which the plugs 9, 19 are to be filled have been formed in the insulation layers 4,6.

Preferably, the insulation film 30 is formed to have a thickness in the range of 1 to 5 nm. The heat resistance of the oxide film is about 100 times the heat resistance of silicon, however, if the thickness is 5 nm or less, heat conductivity will not be substantially inhibited. Furthermore, if the thickness is 1 nm or more, it is possible to obtain enough electric insulation. Therefore, even if the n-type semiconductor layers 3, 13 are eliminated, leak current between the plugs 9, 19 and the substrate 1 can be suppressed. As the insulation film 30, it is also possible to utilize a natural oxide film which is naturally formed by leaving the substrate 1 in the condition that the principal plane is exposed.

Figure 8:
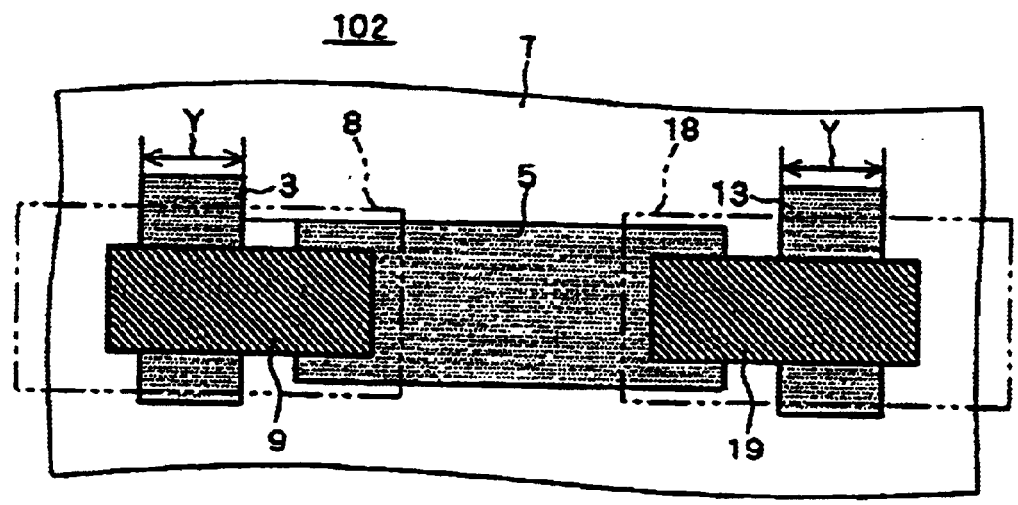
FIG. 8 is a partial sectional view of a device according to the second example of the fourth preferred embodiment.

In a semiconductor device 105 as shown in FIG. 8, the n-type semiconductor layers 3, 13 are formed in the substrate 1, and concentration of the n-type impurities such as phosphorus contained in the semiconductor layers 3, 13 is set in the range of about $10^{16}$ to about $10^{18}$ cm$^{-3}$. Consequently, a Schottky barrier 31 is formed between the semiconductor layers 13 and the plugs 9, 19. As a result of this, since a barrier which is directed opposite to the p-n junction between the semiconductor layers 3, 13 and the semiconductor layer 2 and connected in series to the same is formed, even if a voltage applying forward bias to the p-n junction transiently generates on the wiring layers 8, 18, it is possible to suppress occurrence of leak current. Even in the case where the semiconductor layer 3, 13 are formed as n wells (FIG. 6), by setting the concentration of the n-type impurities in the similar range, it is possible to form the Schottky barrier 31.

Figure 9:
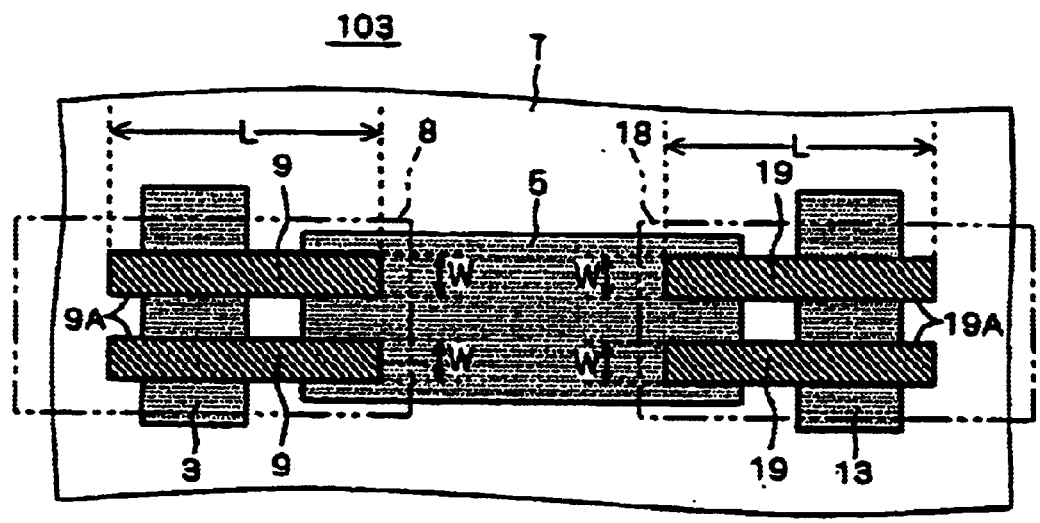
FIG. 9 is a partial sectional view of a device according to the third example of the fourth preferred embodiment.

In a semiconductor device 106 as shown in FIG. 9, the Schottky barrier 31 is formed between the semiconductor layer 2 and the plugs 9, 19 by adjusting the concentration of the p-type impurities such as boron contained in the semiconductor layer 2 in place of forming the n-type semiconductor layers 3, 13 in the substrate 1. Since this Schottky barrier 31 forms a barrier of the same direction as the p-n junction between the semiconductor layers 3, 13 and the semiconductor layer 2 in FIG. 1, leak current is suppressed in the normal operation in which the potential of the wiring layers 8, 18 is equal to or higher than the potential of the substrate 1.

Fifth Preferred Embodiment

Figure 10:
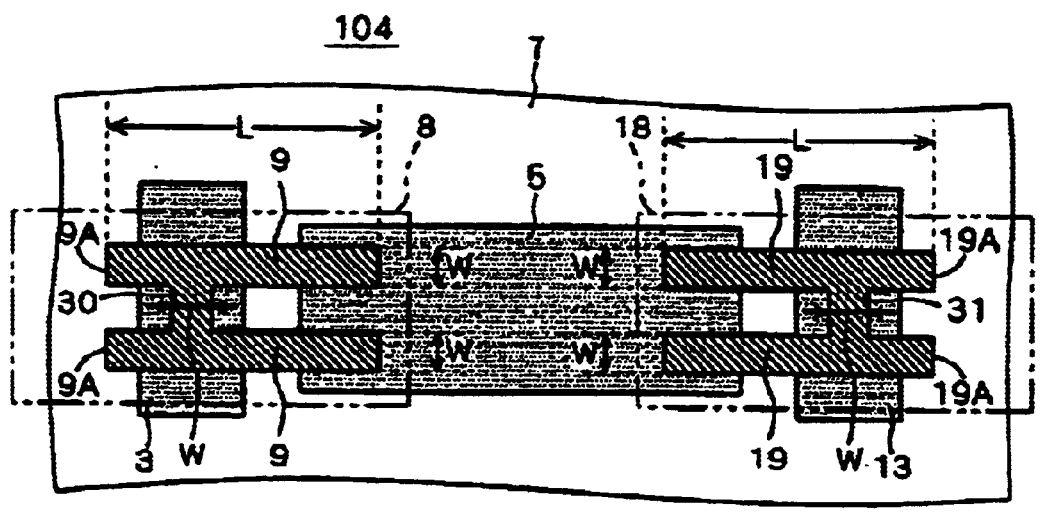
FIG. 10 is a vertical sectional view of a device according to the fifth preferred embodiment.

FIG. 10 is a vertical sectional view of a semiconductor device according to the fifth preferred embodiment of the present invention. This semiconductor device 107 is different in terms of its feature from the semiconductor device 101 according to the first preferred embodiment in that plugs 34, 35 extending from the lower ends of the plugs 7, 17 to the substrate 1 are formed in place of the plugs 9, 19. The plugs 34, 35 are formed so as to fill the contact hoes formed in the insulation layer 4, and the upper ends of the plugs 34, 35 are connected to the lower ends of the plugs 7, 17 and the lower ends thereof are connected to the substrate 1.

In the production process of the semiconductor device 107, by forming the contact holes penetrating through the insulation layers 4, 6 and filling the contact holes with a conductive material such as tungsten, it is possible to concurrently form the plugs 7, 17 and the plugs 34, 35. That is, it is possible to simplify the production process. The heat generated in the heat generating layer 5 is radiated to the wiring layers 8, 18 via the plugs 7, 17 and concurrently radiated to the substrate 1 via the plugs 34, 35, and in addition, the transmission passage from the heat generating layer 5 to the substrate 1 is short, so that radiation property is especially good. Furthermore, since there is no necessity to arrange the plugs 7, 17 and the plugs 9, 19 in separated positions along the principal plane of the substrate 1, miniaturization of the device is not inhibited.

Sixth Preferred Embodiment

Figure 11:
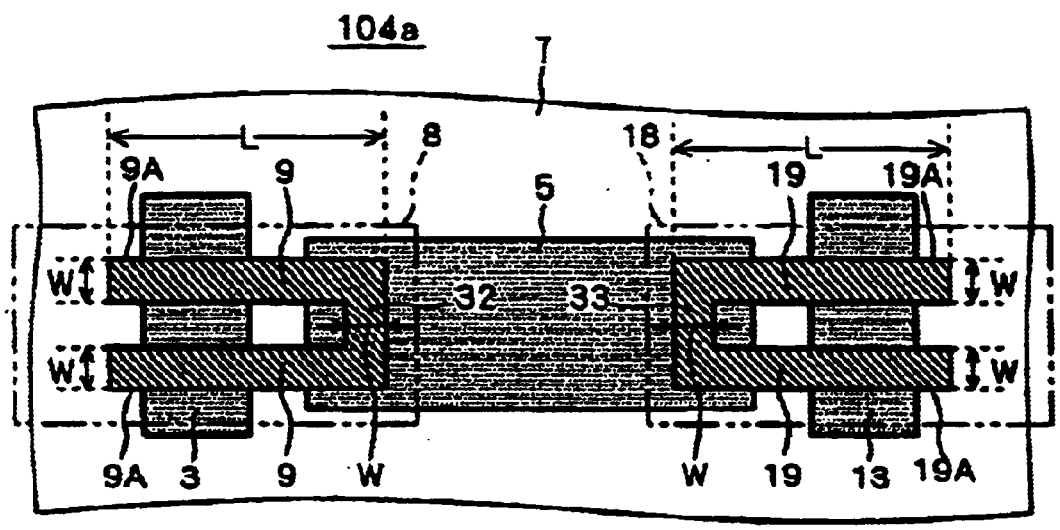
FIG. 11 is a vertical sectional view of a device according to the sixth preferred embodiment.

FIG. 11 is a vertical sectional view of a semiconductor device according to the sixth preferred embodiment of the present invention. This semiconductor device 108 is different in terms of its feature from the semiconductor device 102 according to the second preferred embodiment in that a SOI (Semiconductor On Insulator) substrate 40 is used. In the substrate 1 serving as a supporting substrate, are formed the p-type semiconductor layer 2 and the n-type semiconductor layers 3, 13. On the substrate 1, the insulation layer 4 having a thickness of about 100 nm to about 1 $\mu$m is formed as an embedded oxide film. On the insulation layer 4, the heat generating layer 5 having a thickness of about 50 to about 500 nm is formed as an SOI layer. The heat generating layer 5 is separated from other semiconductor layers not shown by means of a separating insulation film 46. While the complete separating type shown in FIG. 11 can be employed as the separating insulation film 46, the partial separating type shown in FIG. 12 can also be employed. In the case of the partial separating type, there is a well 50 between the separating insulation film 46 and the insulation layer 4. The insulation layer 6 includes the separating insulation film 46 and an insulation layer 48 deposited thereon.

As shown in FIG. 11, in the case where the heat generating layer 5 is a constituent of the n-channel-type MOS transistor device, p-type impurities are introduced to the channel region 20 at a concentration of, for example, $10^{17}$ to $10^{18}$ cm$^{-3}$, while n-type impurities are introduced to the source and drain regions 21, 22 at a concentration of, for example, $10^{19}$ to $10^{21}$ cm$^{-3}$. As shown in FIG. 5, in the case where the additional source and drain regions 21a, 22a are formed, n-type impurities are introduced to these regions 21a, 22a at a concentration of, for example, $10^{18}$ to $10^{21}$ cm$^{-3}$. Furthermore, in the case where the pocket implantation regions 20a, 20b are formed, p-type impurities are introduced to these regions 20a, 20a at a concentration of, for example, $10^{18}$ to $10^{20}$ cm$^{-3}$. The gate insulation film 10 is formed as an oxide film, nitride film or high dielectric constant insulation film having a thickness of, for example, about 1.0 to 10 nm. The gate electrode 23 is formed of, for example, poly-silicon.

In the conventional semiconductor device of the SOI type including the MOS transistor device, since the insulation layer 4 serving as an embedded oxide film is thick and thus the radiation property is poor, when a DC current of 5 mA is fed under the operation of 2 V, for example, temperature rise of about 100 K occurred. As a result of this, mobility of carriers decreases and accordingly the current decreases, which sometimes arose the problem that the inherent characteristics cannot be derived (particularly in a DC-biased analogue circuit). In the semiconductor device 108 according to the present preferred embodiment, by employing the structure similar to that of the second preferred embodiment, the radiation property is improved, so that it is possible to sufficiently derive the inherent characteristic possessed by the SOI-type semiconductor device.

Seventh Preferred Embodiment

Figure 13:
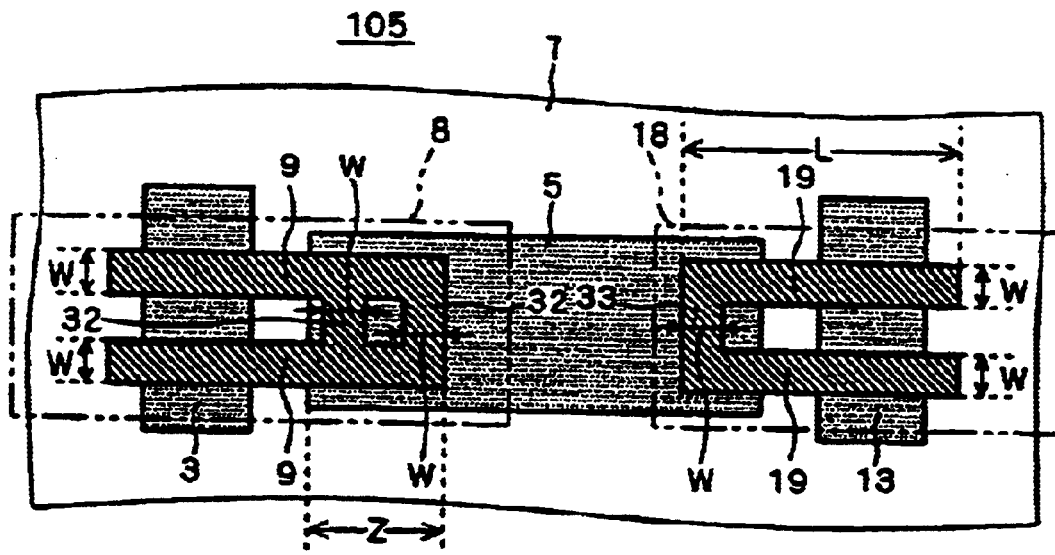
FIG. 13 is a vertical sectional view of a device according to the seventh preferred embodiment.
Figure 14:
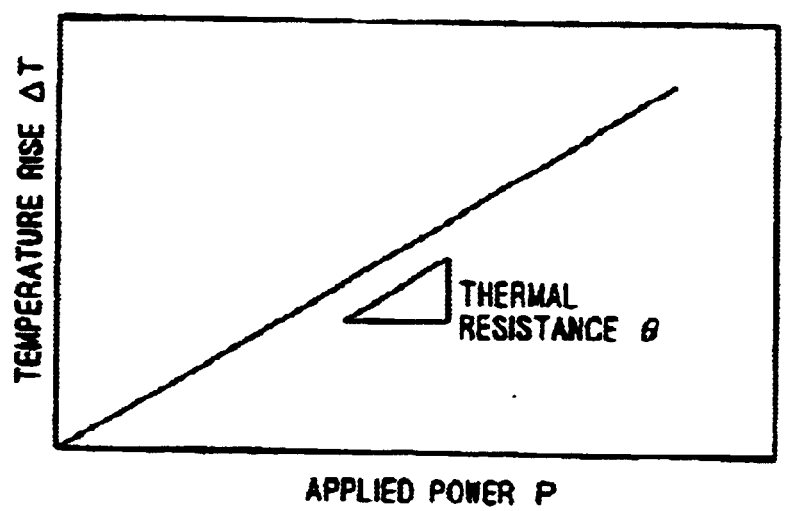
FIG. 14 is a top plan view of the device according to the seventh preferred embodiment.

FIG. 13 is a vertical sectional view of a semiconductor device according to the seventh preferred embodiment of the present invention, and FIG. 14 is a top plan view of the same semiconductor device. FIG. 14 also shows the interior of the semiconductor device in a perspective manner. This semiconductor device 109 is different in terms of its feature from the semiconductor device 102 of the second preferred embodiment in that either one of the wiring layers 8, 18 (wiring layer 18 in FIG. 13) is enlarged to have a width which is larger than the wiring width based on the design rule in a region 55 including the part positioned above one end of the heat generating layer 5 (that is, the part where the plug 17 is connected) and that an electrode material layer 54 connected to the region 55 via a connection plug 52 is disposed directly under the region 55.

As the wiring layer 18 having the region 55 having large width, a stable potential wiring layer which transmits stable potential such as ground wiring layer, source wiring layer or the like is selected. The electrode material layer 54 is as same as the gate electrode 23 in material and thickness, and is embedded in the insulation layer 6 so as to be isolated from the gate electrode 23. The connection plug 52 is embedded in the insulation layer 6 so that its upper end is connected to the region 55 and its lower end is connected to the electrode material layer 54. Preferably, as shown in FIG. 13, a plug 53 of which upper end is connected to the electrode material layer 54 and lower end is connected to the principal plane of the substrate 1 is embedded in the insulation layers 4, 6. At the connection portion between the plug 53 and the substrate 1, for example, the n-type semiconductor layer 13 is formed. The material for the plugs 52 and 53 is, for example, the same as that of the plugs 7, 17.

Since the semiconductor device 109 is configured as described above, the following effects are achieved. That is, since the heat generated at the heat generating layer 5 due to the current supplied via the wiring layers 8, 18 is radiated via the plug 17 to the wiring layer 18 having large width and thus serving as a radiation plate, temperature rise in the heat generating layer 5 is effectively suppressed. Since the wiring layer 18 is a stable potential wiring layer, the parasitic capacitance generated between the wiring layer 18 and the substrate 1 due to the enlarged width will not have an impact on the operation of the semiconductor device 109. Furthermore, since the heat transmitted to the wiring layer 18 is also radiated to the electrode material layer 54 via the connection plug 52, the radiation property is further improved. Since the electrode material layer 54 is isolated from the gate electrode 23, it will not inhibit the function of the gate electrode 23. Furthermore, since the electrode material layer 54 is formed of the same material and having the same thickness as the gate electrode 23, it is possible to form the electrode material layer 54 concurrently with the gate electrode 23 by patterning the electrode material in the course of the production process of the semiconductor device 109, and thus increase of the production cost is suppressed. Furthermore, in the case where the plug 53 is provided, since the heat transmitted to the electrode material layer 54 is also radiated to the substrate 1 via the plug 53, the radiation efficiency is further improved.

More preferably, as shown in the top plan view of FIG. 15, the cross sectional shape of the plugs 17, 52 is set to be rectangle as is the case of the plugs 17, 19 in the semiconductor device 102 according to the second preferred embodiment. The semiconductor device 110 thus set can provide high radiation property as is the semiconductor device 102 without causing difficulty in filling the plugs 17, 52 during the production process.

Figure 17:
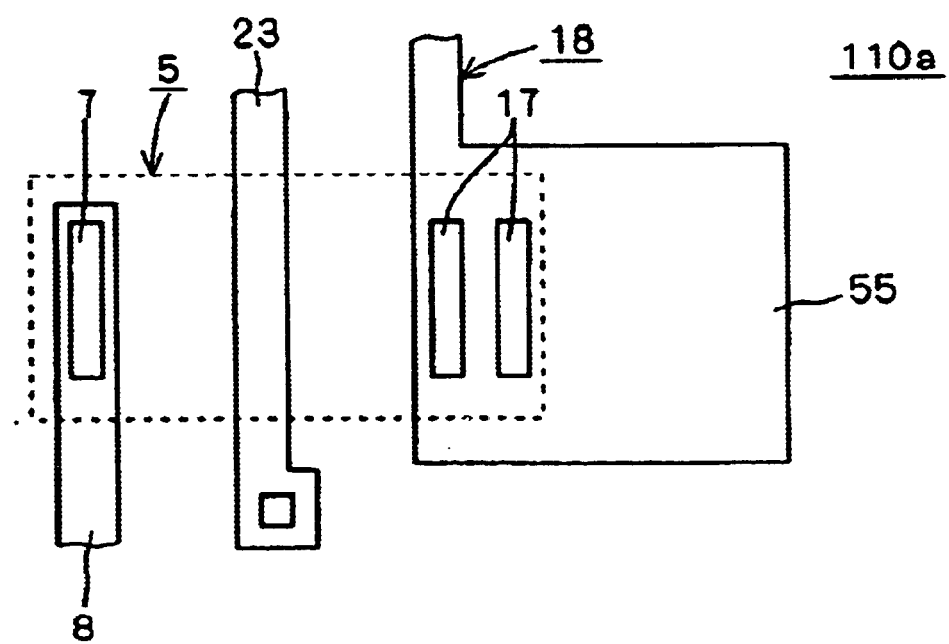
FIG. 17 is a top plan view showing the device of FIG. 16.

FIG. 16 is a vertical sectional view of a semiconductor device according to another example of the present preferred embodiment, and FIG. 17 is a top plan view of the same semiconductor device. FIG. 17 also shows the interior of the semiconductor device in a perspective manner. This semiconductor device 110a is different in terms of its feature from the semiconductor device 110 of FIG. 15 in that the electrode material layer 54 and the connection plugs 52, 53 are eliminated. Corresponding to that the connection plug 53 is eliminated, the n-type semiconductor layer 13 is also eliminated.

In the semiconductor device 110a, though the electrode material layer 54 and the connection plugs 52, 53 are not provided, the large width region 55 is provided and the cross sectional shape of the plug 17 is set to be rectangle, so that correspondingly high radiation efficiency is obtained. In this case, the heat generating layer 5 is not necessarily be a constituent of the MOS transistor device having the gate electrode 23, but may be a resistor.

It goes without saying that the preferred embodiment that the wiring layer 18 serving as a stable potential wiring layer has a large width region 55 and the preferred embodiment in which the electrode material layer 54 is provided can be practiced in combination with other preferred embodiments, and thereby radiation efficiency can further by improved.

Eighth Preferred Embodiment

Figure 18:
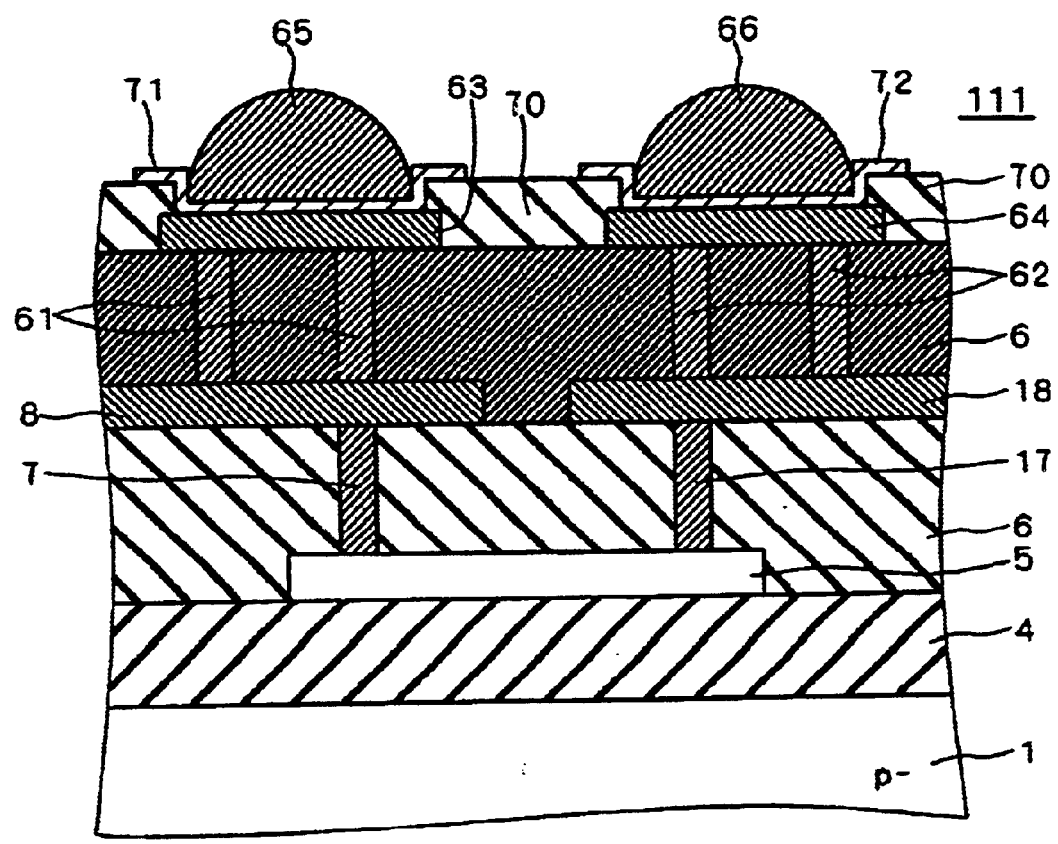
FIG. 18 is a vertical sectional view of a device according to the eighth preferred embodiment.

FIGS. 18 and 19 are vertical sectional views of the semiconductor device according to the eighth preferred embodiment of the present invention. This semiconductor device 111 is different in terms of its feature from the semiconductor device 101 of the first preferred embodiment in that ball electrodes 65, 66, 76 are formed on uppermost wiring layers 63, 64, 74, and a package 80 is further provided.

The uppermost wiring layer 63 disposed on the insulation layer 6 is connected to one end of the heat generating layer 5 via a plug 61 embedded in the insulation layer 6, wiring layer 8 and the plug 7. Similarly, the uppermost wiring layer 64 disposed on the insulation layer 6 is connected to the other end of the heat generating layer 5 via a plug 62 embedded in the insulation layer 6, the wiring layer 18 and the plug 17. Furthermore, the uppermost wiring layer 74 is connected to elements other than the heat generating layer 5 via a plug 73.

The wiring layers 63, 64, 74 are made of the same material as that of, for example, the wiring layers 8, 18, and the plugs 61, 62, 73 are made of the same material as that of, for example, the plugs 7, 17. Between the wiring layers 63, 64, 74 is interposed an insulation layer 70 formed on the insulation layer 6. To the wiring layers 63, 64, 74, the ball electrodes 65, 66, 76 are connected via conductive barrier layers 71, 72, 75. The ball electrodes 65, 66, 76 are, for example, solder balls.

The package 80 is formed so as to cover the insulation layer 6, wiring layers 63, 64, 74 and ball electrodes 65, 66, 76 and comprises an insulation layer 81, wiring layers 82, 83, a conductor 84, wiring layers 85, 86 and external terminals 87, 88. The wiring layers 82 and 83 are disposed on the principal plane of the insulation layer 81 opposing to the insulation layer 6, and connected, for example, to the ball electrodes 66 and 76, respectively. The wiring layers 85 and 86 are disposed on the other principal plane of the insulation layer 81 than that opposing to the insulation layer 6. The external terminals 87, 88 are provided for electric connection with external apparatuses, and formed on the wiring layers 85 and 86, respectively. The external terminals 87 and 88 are, for example, solder balls.

The wiring layer 83 is connected to the external terminal 88 via the conductor 84. On the other hand, the wiring layer 82 is not connected either of the external terminals 87, 88. In the example of FIG. 19, the ball electrode 66 connected to the heat generating layer 5 is not connected either of the external terminals 87, 88 and thus in the condition of electrically floating. In this way, in the semiconductor device 111, besides the normal ball electrode 76 intended for electrical connection with external apparatuses, the special ball electrode 66 intended for only heat radiation of the heat generating layer 5 is provided. As a result of this, the heat generated at the heat generating layer 5 is efficiently radiated to the package via the ball electrode 66. Even in the case where there is no necessity to connect either of one and the other ends of the heat generating layer 5 is electrically connected to external apparatuses, by providing the ball electrode 65 as shown in FIG. 18 and making it be a special electrode for radiation which is electrically isolated from the external electrode as is the ball electrode 66 shown in FIG. 19, it is possible to further improve the radiation efficiency.

While FIG. 18 shows the example where the wiring layers 8, 18, 64, 74 form a double-layer wiring structure, it is also possible to employ a single-layer wiring structure or wiring structures of more than or equal to three layers. In any case, the ball electrodes 65, 66, 76 are necessarily to be formed on the upper most wiring layers.

As shown in FIG. 18, it is not necessary that the plugs 9, 19 are formed and that the cross sectional shape of the plugs 7, 17 is rectangle, however, it is more preferred from the view point of improving the radiation property that the plugs 9, 19 are provided and the cross sectional shape of the plugs 7, 17 is rectangle similarly to the semiconductor device 101 of the first preferred embodiment. In this way, characteristic features of the respective preferred embodiments can combined with each other for practice, and thereby it is possible to further improve the radiation efficiency.

While the invention has been shown and described in detail, the foregoing description is in all aspects illustrative and not restrictive. It is therefore understood that numerous other modifications and variations can be devised without departing from the scope of the invention.

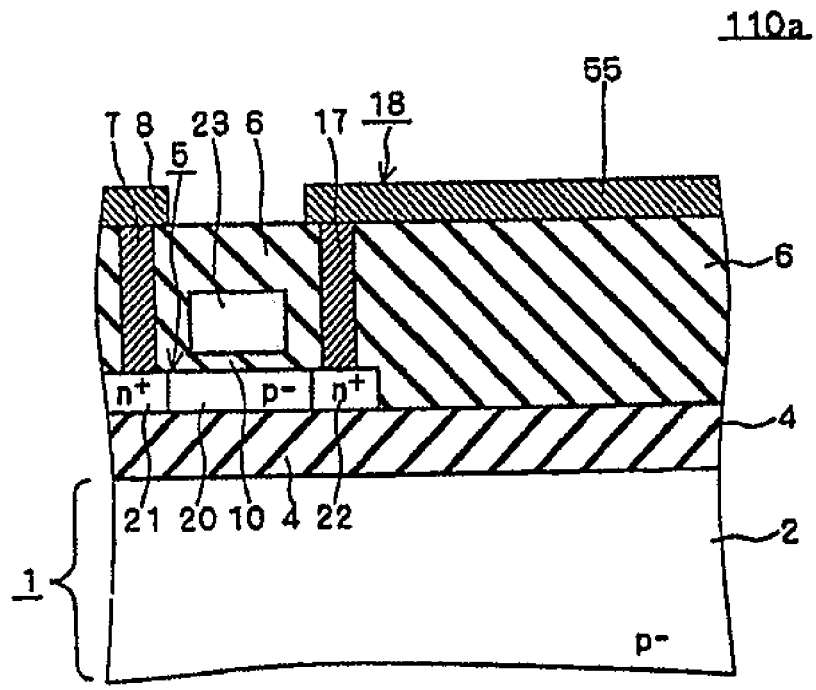

What is claimed is:

1. A semiconductor device comprising:
    a substrate having a principal plane;
    an insulation layer formed on said principal plane;
    a heat generating layer embedded in said insulation layer and opposing to said principal plane with a part of said insulation layer interposed between the heat generating layer and the substrate;
    a first wiring layer disposed on said insulation layer;
    a second wiring layer disposed on said insulation layer;
    a first plug embedded in said insulation layer, a lower end of the first plug being connected to one end of said heat generating layer and an upper end of the first plug being connected to said first wiring layer, said first plug having a rectangular cross sectional shape along said principal plane of which short sides are parallel to a main direction connecting said one end and the other end of said heat generating layer and long sides are parallel to a direction perpendicular to said main direction;
    a second plug embedded in said insulation layer, a lower end of the second plug being connected to said other end of said heat generating layer and an upper end of the second plug connected to said second wiring layer; and
    a third plug embedded in said insulation layer, an upper end of the third plug being connected to said first wiring layer or said first plug and a lower end of the third plug reaching said principal plane, wherein each of the first, second and third plugs is conductive.

2. The semiconductor device according to claim 1, wherein said upper end of said third plug is connected to said first plug.

3. The semiconductor device according to claim 1, wherein said substrate is a semiconductor substrate and comprises a first semiconductor layer of a first conductive type exposed to said principal plane, and a second semiconductor layer of a second conductive type selectively formed to be surrounded by said first semiconductor layer in a position directly under said third plug in said principal plane.

4. The semiconductor device according to claim 1, wherein said insulation layer is made of a low dielectric constant insulator.

5. The semiconductor device according to claim 1, wherein said first wiring layer is a wiring layer for transmitting stable potential, of which width is elongated so as to be larger than or equal to a width based on a design rule in a region including a connection portion between said first wiring layer and said first plug.

6. The semiconductor device according to claim 1, wherein length L of said long sides is set so as to satisfy a following relationship of $L \cdot S \geq 5 \, \mu m \cdot D$ with respect to depth D of said first plug and length S of said short sides.

7. The semiconductor device according to claim 1, wherein said first plug is divided into a plurality of unit plugs,
    a cross sectional shape of each of said plurality of unit plugs along said principal plane is a rectangle of which short sides are parallel to said main direction and long sides are parallel to a direction perpendicular to said main direction;
    length S of said short sides and depth D are common with each other among said plurality of unit plugs, and
    total sum L of length of said long sides of each of said plurality of unit plugs is set so as to satisfy a relationship of $L \cdot S \geq 5 \, \mu m \cdot D$.

8. The semiconductor device according to claims 1, wherein length of said short sides is set in a range of 1.0 to 1.5 times of a plug width based on a design rule.

9. The semiconductor device according to claim 1, wherein a cross sectional shape of said third plug along said principal plane is a rectangle.

10. The semiconductor device according to claim 1, further comprising a fourth plug embedded in said insulation layer, of which upper end is connected to said second wiring layer or said second plug and lower end reaches said principal plane, wherein the fourth plug is conductive.

11. A semiconductor device comprising:
    a substrate having a principal plane;
    an insulation layer formed on said principal plane and made of a low dielectric constant insulator;
    a heat generating layer embedded in said insulation layer and opposing to said principal plane with a part of said insulation layer interposed between the heat generating layer and the substrate;
    a first wiring layer disposed on said insulation layer;
    a second wiring layer disposed on said insulation layer;
    a first plug embedded in said insulation layer, a lower end of the first plug being connected to one end of said heat generating layer and an upper end of the first plug being connected to said first wiring layer;

a second plug embedded in said insulation layer, a lower end of the second plug being connected to an other end of said heat generating layer and an upper end of the second plug being connected to said second wiring layer; and a third plug embedded in said insulation layer, an upper end of the third plug being connected to said first wiring layer or said first plug and a lower end of the third plug reaching said principal plane, wherein each of the first, second and third plugs is conductive.

12. The semiconductor device according to claim 11, wherein said upper end of said third plug is connected to said first plug.

13. The semiconductor device according to claim 11, wherein said substrate is a semiconductor substrate and comprises a first semiconductor layer of a first conductive type exposed to said principal plane, and a second semiconductor layer of a second conductive type selectively formed to be surrounded by said first semiconductor layer in a position directly under said third plug in said principal plane.

14. The semiconductor device according to claim 11, wherein a cross sectional shape of said first plug along said principal plane is a rectangle of which short sides are parallel to a main direction connecting said one end and said other end of said heat generating layer and long sides are parallel to a direction perpendicular to said main direction.

15. The semiconductor device according to claim 11, wherein said first wiring layer is a wiring layer for transmitting stable potential, a width of the first wiring layer being elongated so as to be larger than or equal to a width based on a design rule in a region including a connection portion between said first wiring layer and said first plug.

16. The semiconductor device according to claim 11, wherein a cross sectional shape of said third plug along said principal plane is a rectangle.

17. The semiconductor device according to claim 11, further comprising a fourth plug embedded in said insulation layer, an upper end of the fourth plug being connected to said second wiring layer or said second plug and lower end of the fourth plug reaching said principal plane, wherein the fourth plug is conductive.

18. A semiconductor device comprising:

a semiconductor substrate having a principal plane;

an insulation layer formed on said principal plane;

a heat generating layer embedded in said insulation layer and opposing to said principal plane with a part of said insulation layer interposed between the heat generating layer and the semiconductor substrate;

a first wiring layer disposed on said insulation layer;

a second wiring layer disposed on said insulation layer;

a first plug embedded in said insulation layer, a lower end of the first plug being connected to one end of said heat generating layer and an upper end of the first plug being connected to said first wiring layer;

a second plug embedded in said insulation layer, a lower end of the second plug being connected to an other end of said heat generating layer and an upper end of the second plug being connected to said second wiring layer; and a third plug embedded in said insulation layer, an upper end the third plug being connected to said first wiring layer or said first plug and a lower end of the third plug reaching said principal plane, the third plug forming a Schottky barrier between the third plug and said semiconductor substrate, wherein each of the first, second and third plugs is conductive.

19. The semiconductor device according to claim 18, wherein said upper end of said third plug is connected to said first plug.

20. The semiconductor device according to claim 18, wherein said semiconductor substrate comprises a first semiconductor layer of a first conductive type exposed to said principal plane, and a second semiconductor layer of a second conductive type selectively formed to be surrounded by said first semiconductor layer in the position directly under said third plug in said principal plane.

* * * * *

UNITED STATES PATENT AND TRADEMARK OFFICE
CERTIFICATE OF CORRECTION

PATENT NO. : 6,888,243 B2
APPLICATION NO. : 09/964462
DATED : May 3, 2005
INVENTOR(S) : Yasuo Yamaguchi It is certified that error appears in the above-identified patent and that said Letters Patent is hereby corrected as shown below:

The title page should be deleted to appear as per attached title page.

Signed and Sealed this

Eighth Day of January, 2008

JON W. DUDAS
*Director of the United States Patent and Trademark Office*

(12) United States Patent
Yamaguchi

(10) Patent No.: US 6,888,243 B2
(45) Date of Patent: May 3, 2005

(54) SEMICONDUCTOR DEVICE

(75) Inventor: Yasuo Yamaguchi, Tokyo (JP)

(73) Assignee: Renesas Technology Corp., Tokyo (JP)

(*) Notice: Subject to any disclaimer, the term of this patent is extended or adjusted under 35 U.S.C. 154(b) by 351 days.

(21) Appl. No.: 09/964,462

(22) Filed: Sep. 28, 2001

(65) Prior Publication Data
US 2002/0105079 A1 Aug. 8, 2002

(30) Foreign Application Priority Data
Feb. 6, 2001 (JP) .................... 2001-029807

(51) Int. Cl.⁷ .................................... H01L 23/48
(52) U.S. Cl. ............... 257/748; 257/758; 257/774; 257/471
(58) Field of Search .................. 257/748, 758, 257/280, 613, 471, 774

(56) References Cited

U.S. PATENT DOCUMENTS

| | | | | |
|---|---|---|---|---|
| 4,779,127 A | * | 10/1988 | Honjo | 357/41 |
| 5,444,013 A | * | 8/1995 | Aitken et al. | 437/182 |
| 5,457,344 A | * | 10/1995 | Bartelink | 257/737 |
| 5,900,668 A | * | 5/1999 | Wollesen | 257/522 |
| 5,937,321 A | * | 8/1999 | Beck et al. | 438/622 |
| 5,994,777 A | * | 11/1999 | Farrar | 257/758 |
| 6,034,433 A | * | 3/2000 | Beatty | 257/758 |
| 6,078,106 A | * | 6/2000 | Kawata | 257/758 |
| 6,100,589 A | * | 8/2000 | Tanaka | 257/758 |
| 6,124,604 A | * | 9/2000 | Koyama et al. | 257/72 |
| 6,130,449 A | * | 10/2000 | Matsuoka | 257/296 |
| 6,222,270 B1 | * | 4/2001 | Lee | 257/758 |
| 6,246,118 B1 | * | 6/2001 | Buynoski | 257/758 |
| 6,297,563 B1 | * | 10/2001 | Yamaha | 257/781 |
| 6,307,252 B1 | * | 10/2001 | Knoedl, Jr. | 257/659 |
| 6,337,517 B1 | * | 1/2002 | Ohta et al. | 257/758 |
| 6,404,001 B2 | * | 6/2002 | Koo et al. | 257/296 |

FOREIGN PATENT DOCUMENTS

| | | |
|---|---|---|
| JP | 3-248458 | 11/1991 |
| JP | 5-347412 | 12/1993 |
| JP | 10-270704 | 10/1998 |
| JP | 11-135799 | 5/1999 |
| JP | 11-238754 | 8/1999 |
| JP | 11-354807 | 12/1999 |

* cited by examiner

Primary Examiner—David L Talbott
Assistant Examiner—Lourdes Cruz
(74) Attorney, Agent, or Firm—Oblon, Spivak, McClelland, Maier & Neustadt, P.C.

(57) ABSTRACT

To improve the radiation property without inhibiting miniaturization of the device, heat generated at a heat generating layer (5) is radiated to a substrate (1) via plugs (7, 17), wiring layers (8, 18), and plugs (9, 19). A cross sectional along the principal plane of the substrate (1) of the plugs (7, 9, 17, 19) is set to be a rectangle, and the long sides of the rectangle are parallel to the direction perpendicular to the direction connecting one end and the other end of the heat generating layer (5). Between the plugs (9, 19) and the semiconductor layer (2) is interposed n-type semiconductor layers (3, 13).

20 Claims, 12 Drawing Sheets

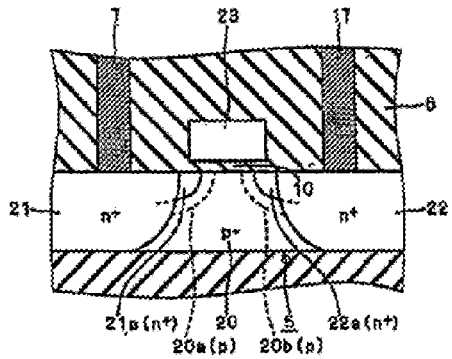

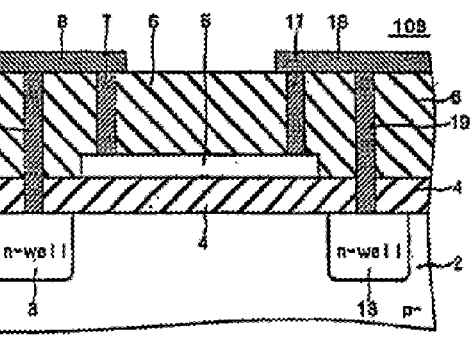

UNITED STATES PATENT AND TRADEMARK OFFICE
CERTIFICATE OF CORRECTION

PATENT NO.         : 6,888,243 B2
APPLICATION NO.    : 09/964462
DATED              : May 3, 2005
INVENTOR(S)        : Yasuo Yamaguchi It is certified that error appears in the above-identified patent and that said Letters Patent is hereby corrected as shown below:

In the drawings, please replace figure 1 with the following figure 1:

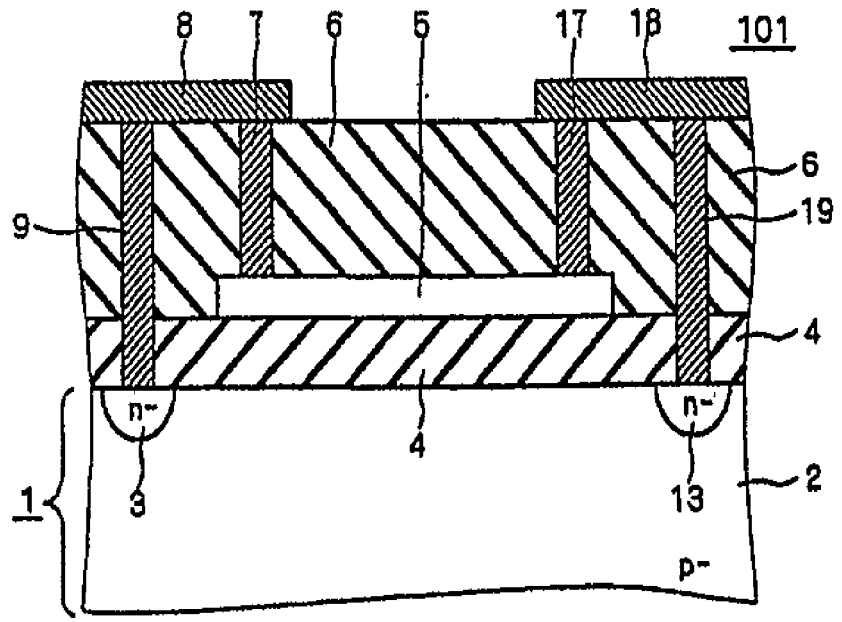

UNITED STATES PATENT AND TRADEMARK OFFICE
CERTIFICATE OF CORRECTION

PATENT NO.          : 6,888,243 B2
APPLICATION NO.  : 09/964462
DATED                    : May 3, 2005
INVENTOR(S)         : Yasuo Yamaguchi It is certified that error appears in the above-identified patent and that said Letters Patent is hereby corrected as shown below:

In the drawings, please replace figure 2 with the following figure 2:

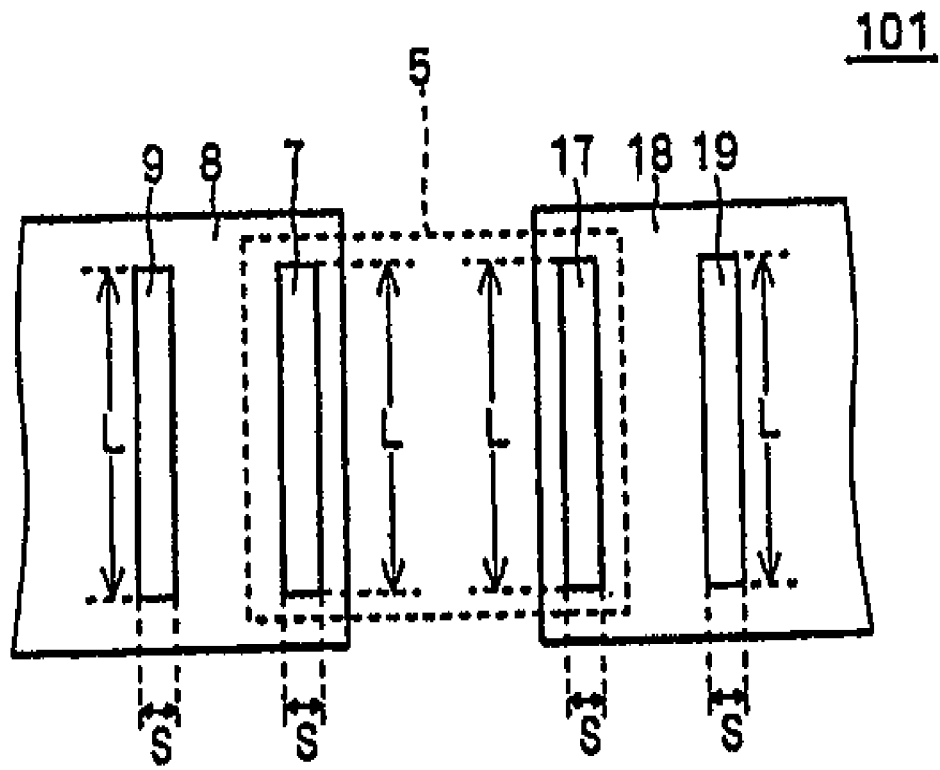

UNITED STATES PATENT AND TRADEMARK OFFICE
CERTIFICATE OF CORRECTION

| | |
|---|---|
| PATENT NO. | : 6,888,243 B2 |
| APPLICATION NO. | : 09/964462 |
| DATED | : May 3, 2005 |
| INVENTOR(S) | : Yasuo Yamaguchi |

It is certified that error appears in the above-identified patent and that said Letters Patent is hereby corrected as shown below:

In the drawings, please replace figure 3 with the following figure 3:

FIG. 3

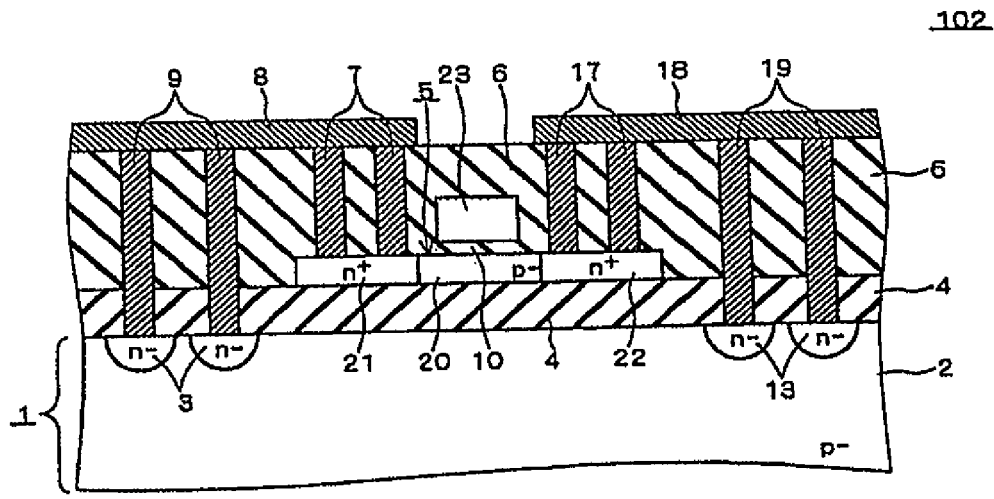

UNITED STATES PATENT AND TRADEMARK OFFICE
CERTIFICATE OF CORRECTION

PATENT NO. : 6,888,243 B2
APPLICATION NO. : 09/964462
DATED : May 3, 2005
INVENTOR(S) : Yasuo Yamaguchi It is certified that error appears in the above-identified patent and that said Letters Patent is hereby corrected as shown below:

In the drawings, please replace figure 4 with the following figure 4:

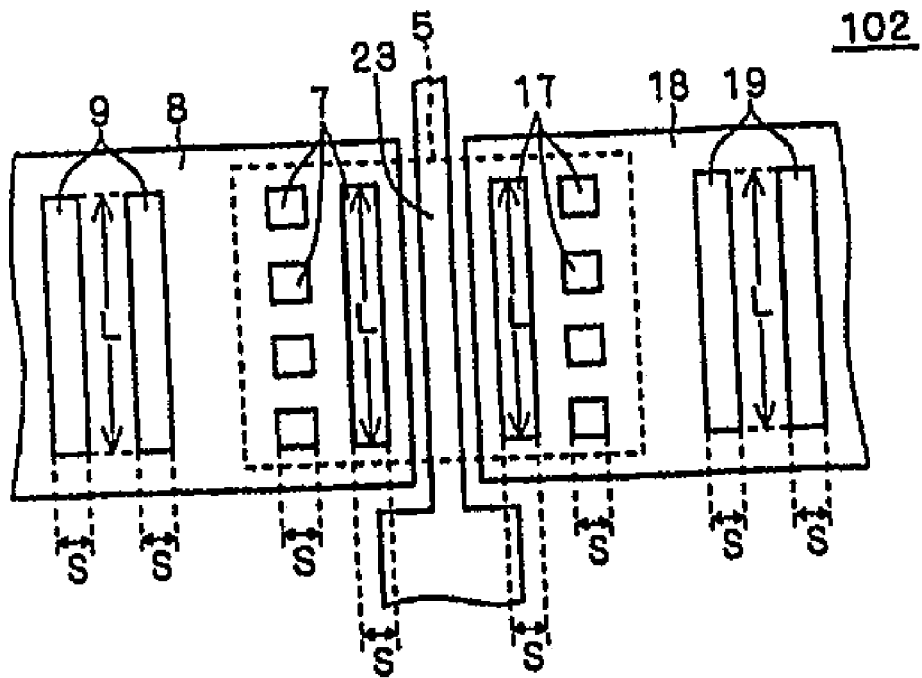

UNITED STATES PATENT AND TRADEMARK OFFICE
CERTIFICATE OF CORRECTION

PATENT NO. : 6,888,243 B2
APPLICATION NO. : 09/964462
DATED : May 3, 2005
INVENTOR(S) : Yasuo Yamaguchi It is certified that error appears in the above-identified patent and that said Letters Patent is hereby corrected as shown below:

In the drawings, please replace figure 5 with the following figure 5:

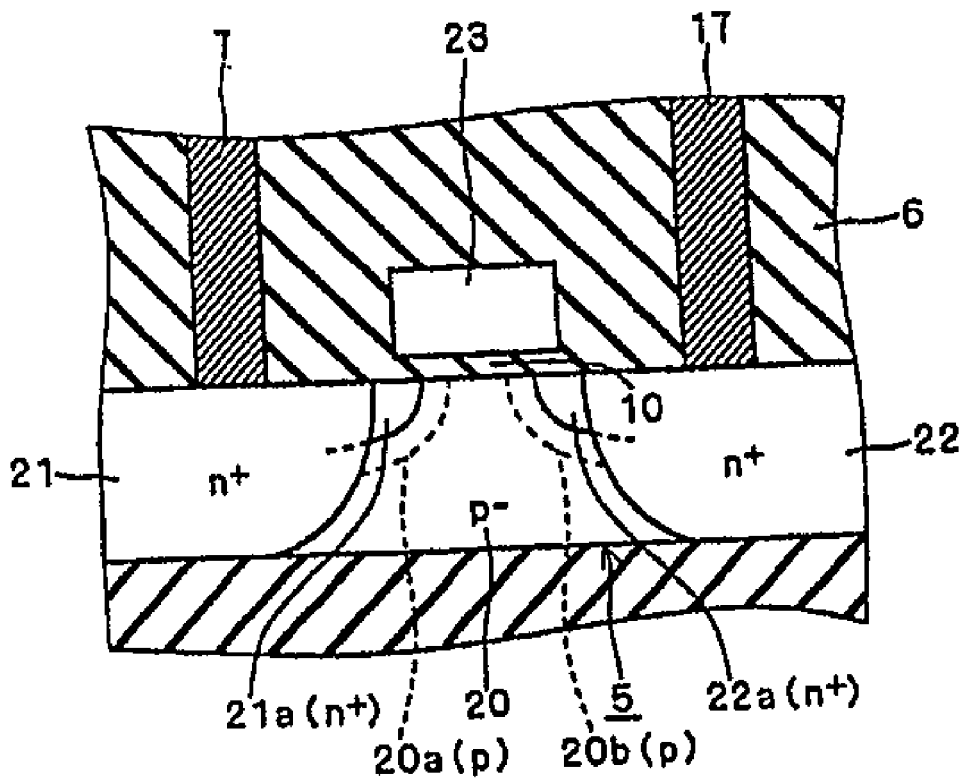

UNITED STATES PATENT AND TRADEMARK OFFICE
CERTIFICATE OF CORRECTION

PATENT NO. : 6,888,243 B2
APPLICATION NO. : 09/964462
DATED : May 3, 2005
INVENTOR(S) : Yasuo Yamaguchi It is certified that error appears in the above-identified patent and that said Letters Patent is hereby corrected as shown below:

In the drawings, please replace figure 6 with the following figure 6:

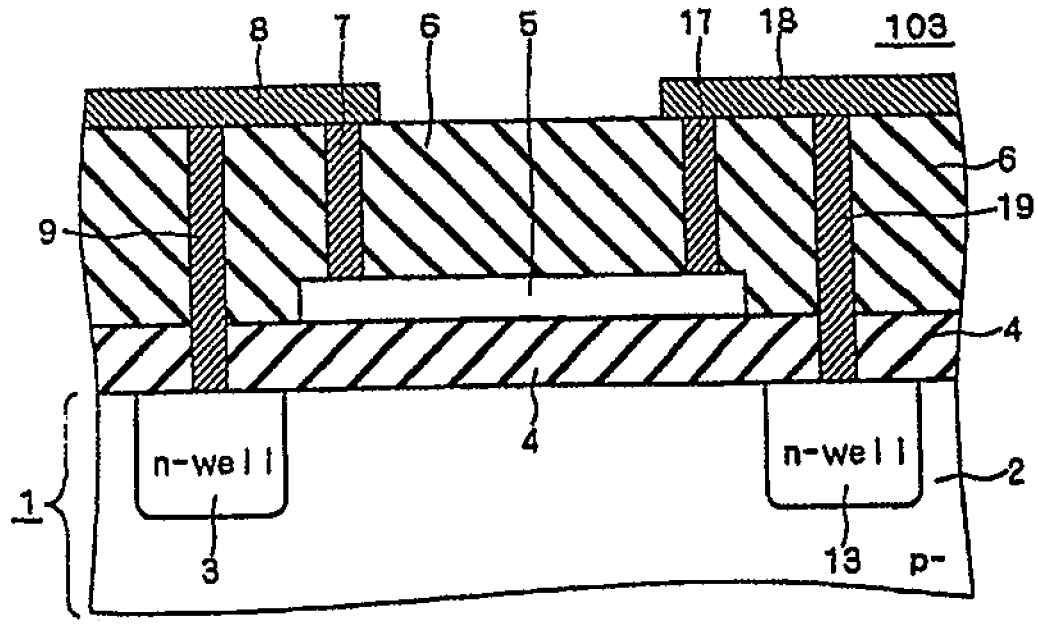

UNITED STATES PATENT AND TRADEMARK OFFICE
CERTIFICATE OF CORRECTION

| | |
|---|---|
| PATENT NO. | : 6,888,243 B2 |
| APPLICATION NO. | : 09/964462 |
| DATED | : May 3, 2005 |
| INVENTOR(S) | : Yasuo Yamaguchi |

It is certified that error appears in the above-identified patent and that said Letters Patent is hereby corrected as shown below:

In the drawings, please replace figure 7 with the following figure 7:

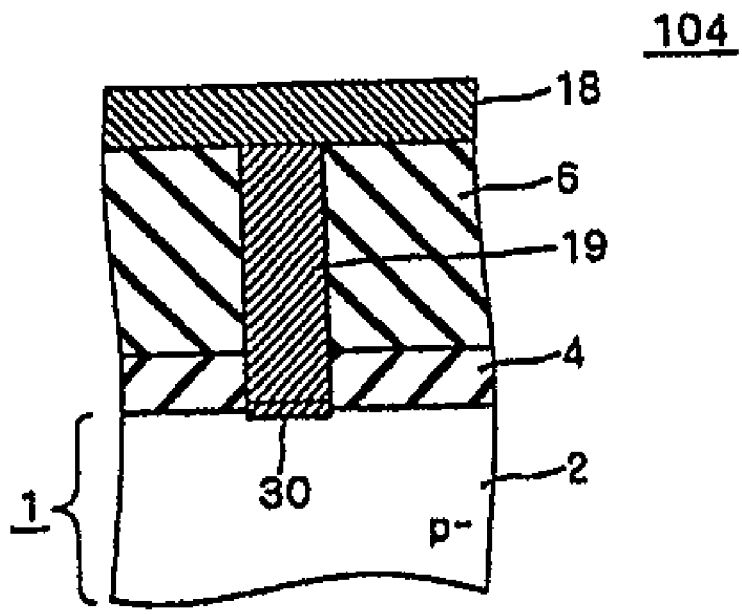

FIG. 7

UNITED STATES PATENT AND TRADEMARK OFFICE
CERTIFICATE OF CORRECTION

PATENT NO. : 6,888,243 B2
APPLICATION NO. : 09/964462
DATED : May 3, 2005
INVENTOR(S) : Yasuo Yamaguchi It is certified that error appears in the above-identified patent and that said Letters Patent is hereby corrected as shown below:

In the drawings, please replace figure 8 with the following figure 8:

FIG. 8

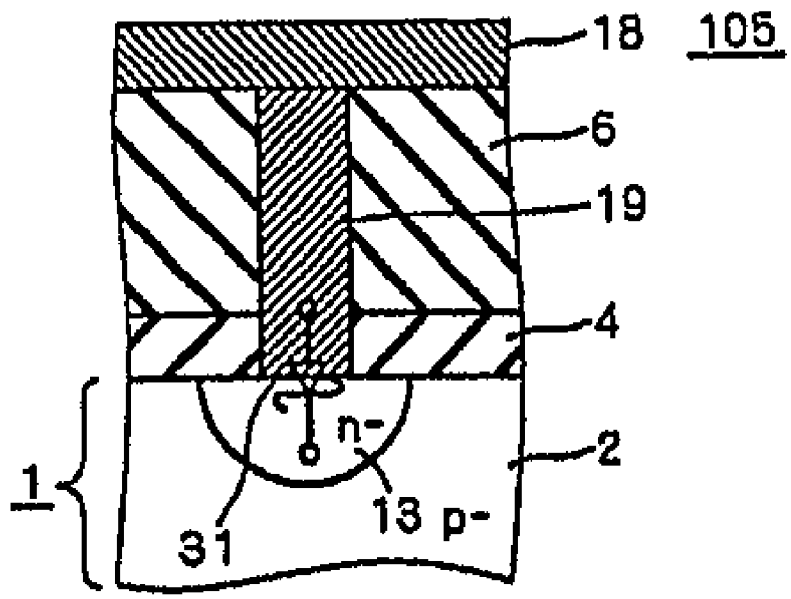

UNITED STATES PATENT AND TRADEMARK OFFICE
CERTIFICATE OF CORRECTION

PATENT NO. : 6,888,243 B2
APPLICATION NO. : 09/964462
DATED : May 3, 2005
INVENTOR(S) : Yasuo Yamaguchi It is certified that error appears in the above-identified patent and that said Letters Patent is hereby corrected as shown below:

In the drawings, please replace figure 9 with the following figure 9:

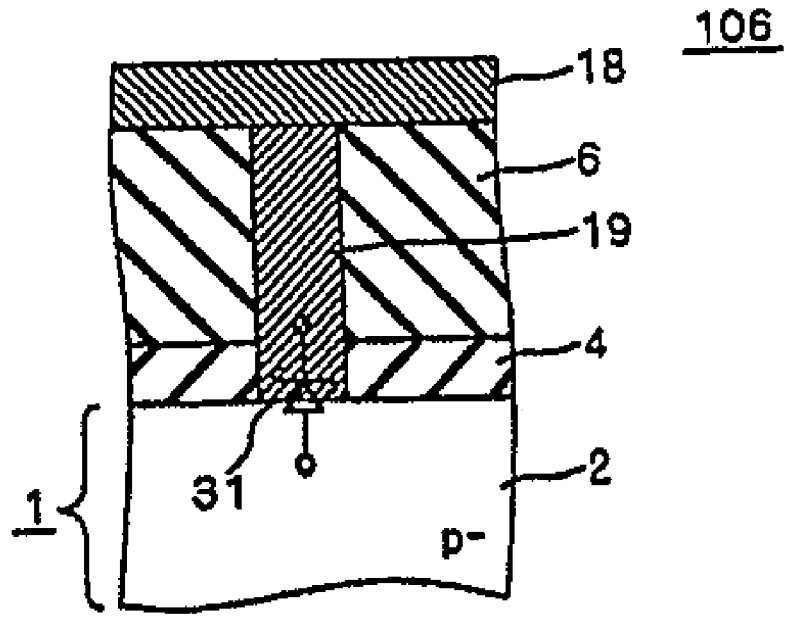

UNITED STATES PATENT AND TRADEMARK OFFICE
CERTIFICATE OF CORRECTION

PATENT NO.       : 6,888,243 B2
APPLICATION NO.  : 09/964462
DATED            : May 3, 2005
INVENTOR(S)      : Yasuo Yamaguchi It is certified that error appears in the above-identified patent and that said Letters Patent is hereby corrected as shown below:

In the drawings, please replace figure 10 with the following figure 10:

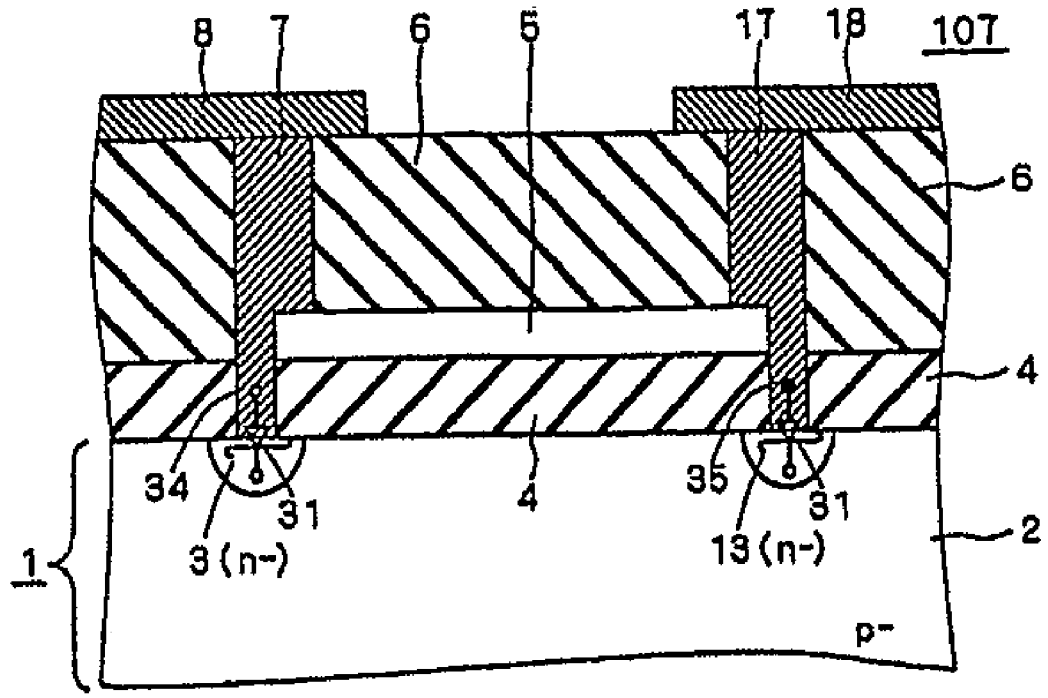

FIG. 10

UNITED STATES PATENT AND TRADEMARK OFFICE
CERTIFICATE OF CORRECTION

PATENT NO. : 6,888,243 B2
APPLICATION NO. : 09/964462
DATED : May 3, 2005
INVENTOR(S) : Yasuo Yamaguchi It is certified that error appears in the above-identified patent and that said Letters Patent is hereby corrected as shown below:

In the drawings, please replace figure 11 with the following figure 11:

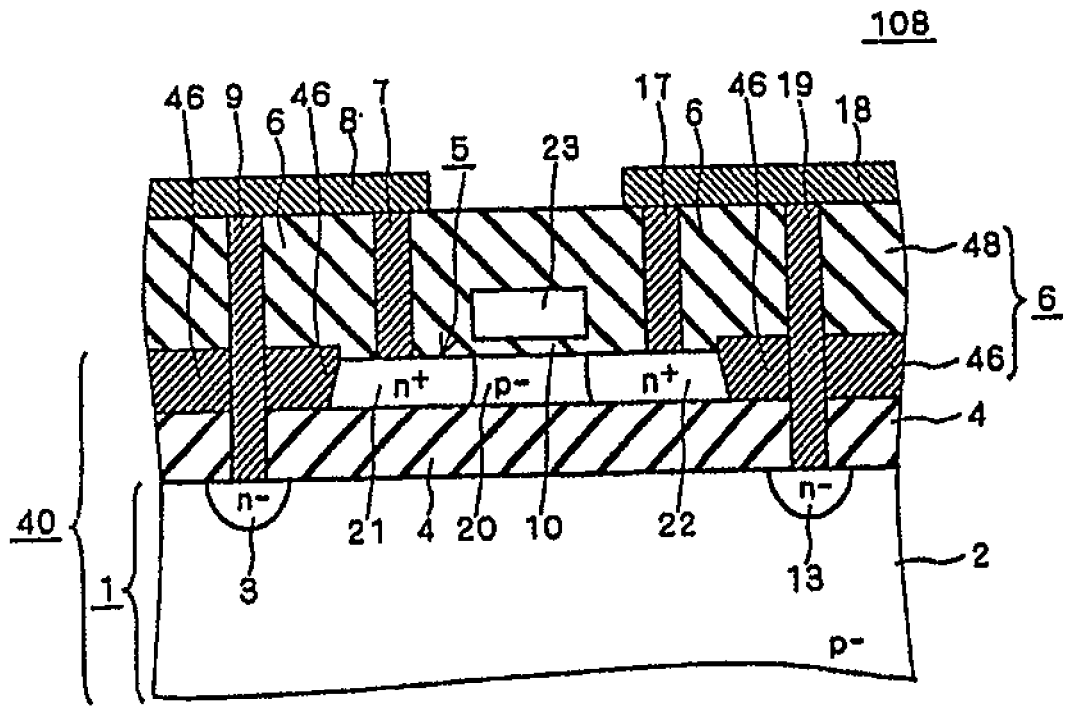

UNITED STATES PATENT AND TRADEMARK OFFICE
CERTIFICATE OF CORRECTION

| | |
|---|---|
| PATENT NO. | : 6,888,243 B2 |
| APPLICATION NO. | : 09/964462 |
| DATED | : May 3, 2005 |
| INVENTOR(S) | : Yasuo Yamaguchi |

Figure 12:
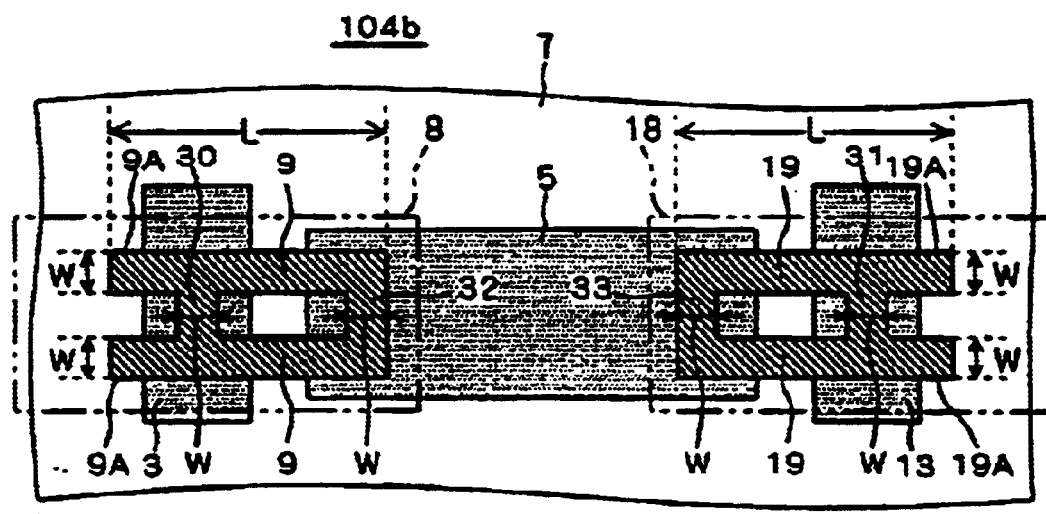
FIG. 12 is a partially enlarged sectional view of a device according to another example of the sixth preferred embodiment.

It is certified that error appears in the above-identified patent and that said Letters Patent is hereby corrected as shown below:

In the drawings, please replace figure 12 with the following figure 12:

FIG. 12

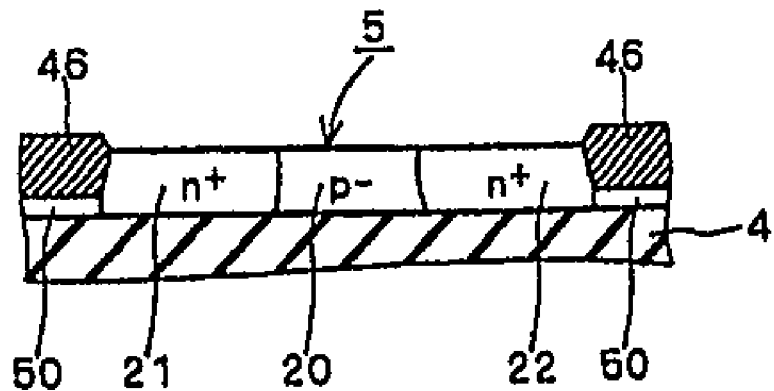

UNITED STATES PATENT AND TRADEMARK OFFICE
CERTIFICATE OF CORRECTION

PATENT NO. : 6,888,243 B2
APPLICATION NO. : 09/964462
DATED : May 3, 2005
INVENTOR(S) : Yasuo Yamaguchi It is certified that error appears in the above-identified patent and that said Letters Patent is hereby corrected as shown below:

In the drawings, please replace figure 13 with the following figure 13:

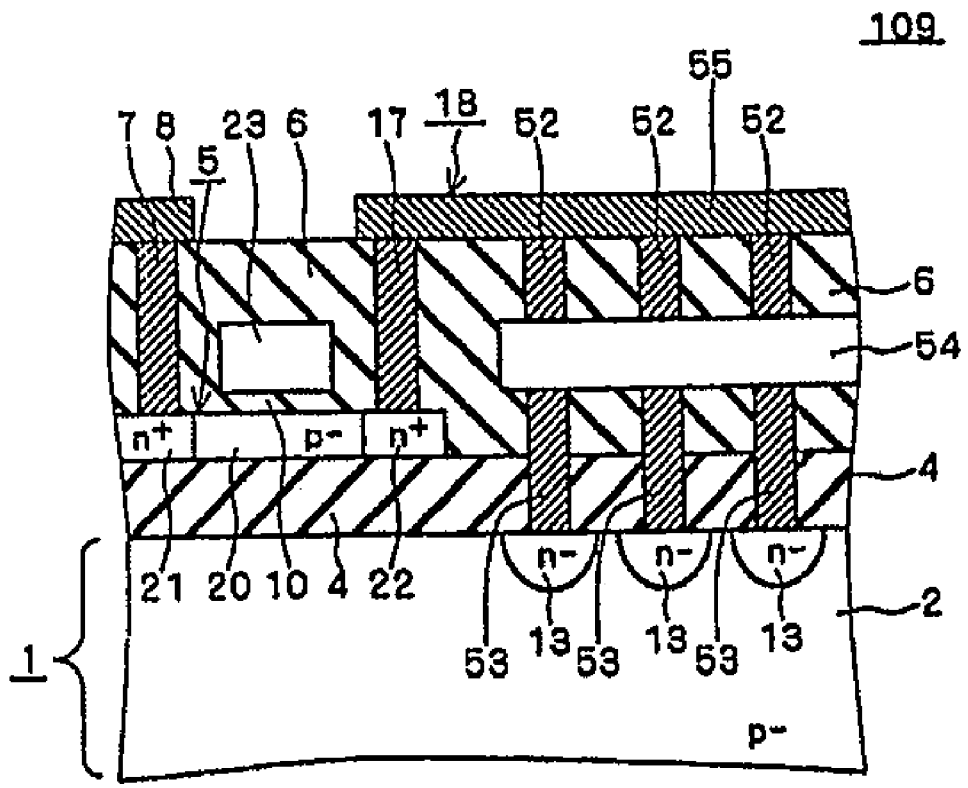

UNITED STATES PATENT AND TRADEMARK OFFICE
CERTIFICATE OF CORRECTION

PATENT NO.      : 6,888,243 B2
APPLICATION NO. : 09/964462
DATED           : May 3, 2005
INVENTOR(S)     : Yasuo Yamaguchi It is certified that error appears in the above-identified patent and that said Letters Patent is hereby corrected as shown below:

In the drawings, please replace figure 14 with the following figure 14:

FIG. 14

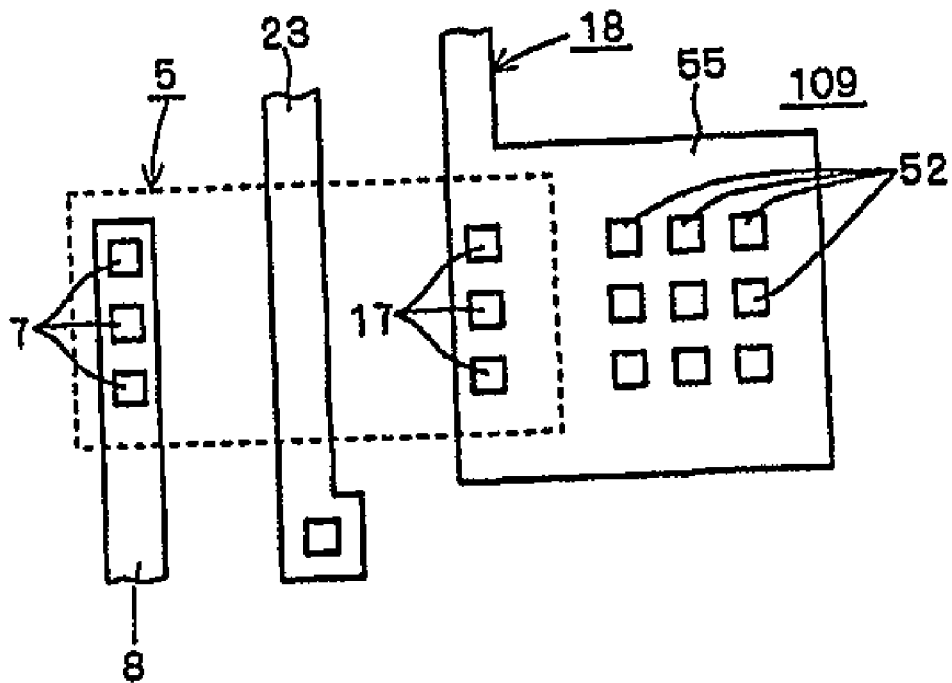

UNITED STATES PATENT AND TRADEMARK OFFICE
CERTIFICATE OF CORRECTION

PATENT NO. : 6,888,243 B2
APPLICATION NO. : 09/964462
DATED : May 3, 2005
INVENTOR(S) : Yasuo Yamaguchi It is certified that error appears in the above-identified patent and that said Letters Patent is hereby corrected as shown below:

In the drawings, please replace figure 15 with the following figure 15:

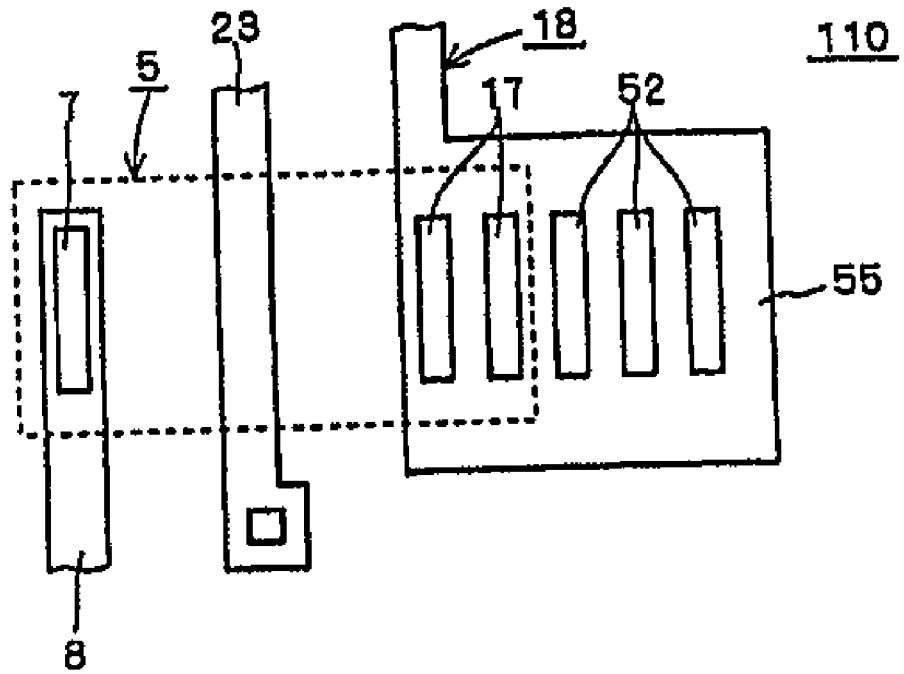

FIG. 15

UNITED STATES PATENT AND TRADEMARK OFFICE
CERTIFICATE OF CORRECTION

PATENT NO.        : 6,888,243 B2
APPLICATION NO. : 09/964462
DATED                : May 3, 2005
INVENTOR(S)       : Yasuo Yamaguchi It is certified that error appears in the above-identified patent and that said Letters Patent is hereby corrected as shown below:

In the drawings, please replace figure 16 with the following figure 16: